(12) United States Patent
Maruyama et al.

(10) Patent No.: US 7,407,870 B2
(45) Date of Patent: *Aug. 5, 2008

(54) METHOD FOR MANUFACTURING SEMICONDUCTOR DEVICE

(75) Inventors: Junya Maruyama, Ebina (JP); Yumiko Ohno, Atsugi (JP); Toru Takayama, Atsugi (JP); Yuugo Goto, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/410,073

(22) Filed: Apr. 25, 2006

(65) Prior Publication Data

US 2006/0189097 A1 Aug. 24, 2006

Related U.S. Application Data

(62) Division of application No. 10/740,437, filed on Dec. 22, 2003, now Pat. No. 7,045,442.

(30) Foreign Application Priority Data

Dec. 27, 2002 (JP) .............................. 2002-382008

(51) Int. Cl.
*H01L 21/46* (2006.01)
(52) U.S. Cl. .................. 438/458; 438/459; 438/476
(58) Field of Classification Search .................. 438/455, 438/458, 459, 464, 471, 475, 476
See application file for complete search history.

(56) References Cited

U.S. PATENT DOCUMENTS 5,815,223 A 9/1998 Watanabe et al.
5,834,327 A 11/1998 Yamazaki et al.

(Continued)

FOREIGN PATENT DOCUMENTS

EP 0 858 101 8/1998

(Continued)

OTHER PUBLICATIONS

*Realization of a display that is thin, light and unbreakable*, Nikkei Microdevices, Jul. 1, 2002, pp. 71-72.
A.J. Auberton-Herve et al., *Industrial Research Society (Kogyo Chosa Kai)*, Aug. 1, 1997, pp. 83-87.
EPO Search Report dated Jul. 21, 2005 for Application No. 03015816.6.
Office Action (U.S. Appl. No. 200310124240.4 Dated Mar. 2, 2007).

*Primary Examiner*—M. Wilczewski
*Assistant Examiner*—Khanh Duong
(74) *Attorney, Agent, or Firm*—Eric J. Robinson; Robinson Intellectual Property Law Office, P.C.

(57) ABSTRACT

The present invention is a separation method for easy separation of an allover release layer with a large area. Further, the present invention is the separating method that is not subjected to restrictions in the use of substrates, such as a kind of substrate, during forming a release layer. A separation method comprising the steps of forming a metal film, a first oxide, and a semiconductor film containing hydrogen in this order; and bonding a support to a release layer containing the first oxide and the semiconductor film and separating the release layer bonded to the support from a substrate provided with the metal layer by a physical means. Through the separation method, heat treatment is carried out to diffuse hydrogen contained in the semiconductor film, a third oxide is formed by reducing a second oxide formed at a surface boundary between the metal film and the first oxide film, and a film containing the second oxide and the third oxide, a surface boundary between the film containing the second oxide and the third oxide, and the metal film, or a surface boundary between the film containing the second oxide and the third oxide, and the first oxide is split.

28 Claims, 22 Drawing Sheets

U.S. PATENT DOCUMENTS

| | | |
|---|---|---|
| 5,990,542 A | 11/1999 | Yamazaki |
| 6,127,199 A | 10/2000 | Inoue et al. |
| 6,153,495 A | 11/2000 | Kub et al. |
| 6,271,101 B1 | 8/2001 | Fukunaga |
| 6,290,804 B1 | 9/2001 | Henley et al. |
| 6,309,950 B1 | 10/2001 | Forbes |
| 6,319,757 B1 | 11/2001 | Parsons et al. |
| 6,333,215 B1 | 12/2001 | Matsuda et al. |
| 6,372,608 B1 | 4/2002 | Shimoda et al. |
| 6,410,436 B2 | 6/2002 | Yamagata et al. |
| 6,423,614 B1 | 7/2002 | Doyle |
| 6,441,468 B1 | 8/2002 | Yamazaki |
| 6,445,059 B1 | 9/2002 | Yamazaki |
| 6,521,511 B1 | 2/2003 | Inoue et al. |
| 6,527,964 B1 | 3/2003 | Smith et al. |
| 6,534,382 B1 | 3/2003 | Sakaguchi et al. |
| 6,569,595 B1 | 5/2003 | Sato et al. |
| 6,593,213 B2 | 7/2003 | Stanbery |
| 6,602,761 B2 | 8/2003 | Fukunaga |
| 6,624,046 B1 | 9/2003 | Zavracky et al. |
| 6,627,518 B1 | 9/2003 | Inoue et al. |
| 6,645,830 B2 | 11/2003 | Shimoda et al. |
| 6,653,209 B1 | 11/2003 | Yamagata |
| 6,682,963 B2 | 1/2004 | Ishikawa |
| RE38,466 E | 3/2004 | Inoue et al. |
| 6,700,631 B1 | 3/2004 | Inoue et al. |
| 6,744,116 B1 | 6/2004 | Doyle |
| 6,756,286 B1 | 6/2004 | Moriceau et al. |
| 6,811,945 B2 | 11/2004 | Kobayashi |
| 6,814,832 B2 * | 11/2004 | Utsunomiya ............... 156/230 |
| 6,818,530 B2 | 11/2004 | Shimoda et al. |
| 6,828,214 B2 | 12/2004 | Notsu et al. |
| 6,852,653 B2 | 2/2005 | Yamazaki et al. |
| 6,878,607 B2 | 4/2005 | Inoue et al. |
| 6,885,389 B2 | 4/2005 | Inoue et al. |
| 6,995,973 B2 | 2/2006 | Barsun et al. |
| 7,045,438 B2 * | 5/2006 | Yamazaki et al. ........... 438/455 |
| 7,045,442 B2 * | 5/2006 | Maruyama et al. .......... 438/458 |
| 7,094,665 B2 | 8/2006 | Shimoda et al. |
| 2001/0004121 A1 | 6/2001 | Sakama et al. |
| 2001/0015256 A1 | 8/2001 | Yamazaki et al. |
| 2002/0146893 A1 | 10/2002 | Shimoda et al. |
| 2002/0175345 A1 | 11/2002 | Yamazaki |
| 2003/0008437 A1 | 1/2003 | Inoue et al. |
| 2003/0032210 A1 | 2/2003 | Takayama et al. |
| 2003/0040164 A1 | 2/2003 | Inoue et al. |
| 2003/0064569 A1 | 4/2003 | Takayama et al. |
| 2003/0217805 A1 | 11/2003 | Takayama et al. |
| 2003/0224582 A1 | 12/2003 | Shimoda et al. |
| 2004/0087110 A1 | 5/2004 | Takayama et al. |
| 2004/0129960 A1 | 7/2004 | Maruyama et al. |
| 2004/0140547 A1 | 7/2004 | Yamazaki et al. |
| 2004/0169786 A1 | 9/2004 | Yamazaki et al. |
| 2004/0219762 A1 | 11/2004 | Shimoda et al. |
| 2004/0232413 A1 | 11/2004 | Yamazaki et al. |
| 2004/0256618 A1 | 12/2004 | Imai et al. |
| 2004/0263712 A1 | 12/2004 | Yamazaki et al. |
| 2005/0023526 A1 | 2/2005 | Yamazaki |
| 2005/0052584 A1 | 3/2005 | Yamazaki et al. |
| 2007/0032042 A1 | 2/2007 | Takayama et al. |

FOREIGN PATENT DOCUMENTS

| | | |
|---|---|---|
| EP | 0 858 110 | 8/1998 |
| EP | 0924769 | 6/1999 |
| EP | 1014452 | 6/2000 |
| EP | 1351308 | 10/2003 |
| EP | 1 363 319 | 11/2003 |
| JP | 10-125929 | 5/1998 |
| JP | 10-125930 | 5/1998 |
| JP | 10-125931 | 5/1998 |
| JP | 11-243209 | 9/1999 |
| JP | 2001-189460 | 7/2001 |
| WO | WO-99/044242 | 9/1999 |

* cited by examiner

FIG. 2
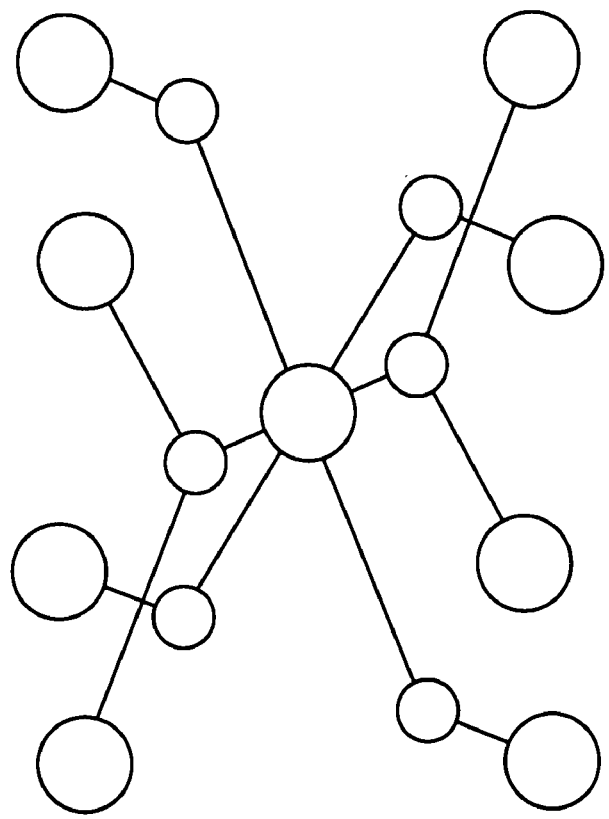
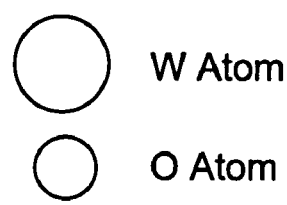
W Atom
O Atom

Sample 1
500°C

Sample 2
450°C

Sample 3
425°C

Sample 4
410°C

Sample 5
400°C

Sample 6

Sample 7
350°C

Sample 8

Sample 8

Sample 9

Sample 9

Sample A 10 nm

Sample B 10 nm

Sample C 10 nm

Sample A

Sample B

Sample C

Without Heating

With Heating

Sample D 10 nm

Metal Oxide Film
(Tungsten Oxide)

Metal Film
(Tungsten)

Base Film
(Silicon Oxynitride Film)

Sample E 10 nm 10 nm

Amorphous Silicon Film
(Sputtering)

Metal Film
(Tungsten)

Base Film
(Silicon Oxynitride Film)

Sample F 10 nm

Protective Film
(Silicon Oxide Film, Sputtering)

Metal Oxide Film
(Tungsten Oxide)

Metal Film
(Tungsten)

Base Film
(Silicon Oxynitride Film)

Sample G

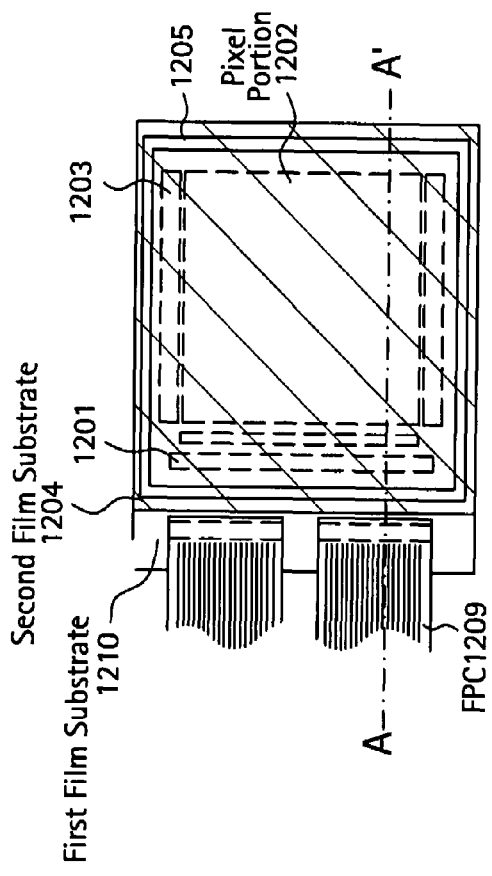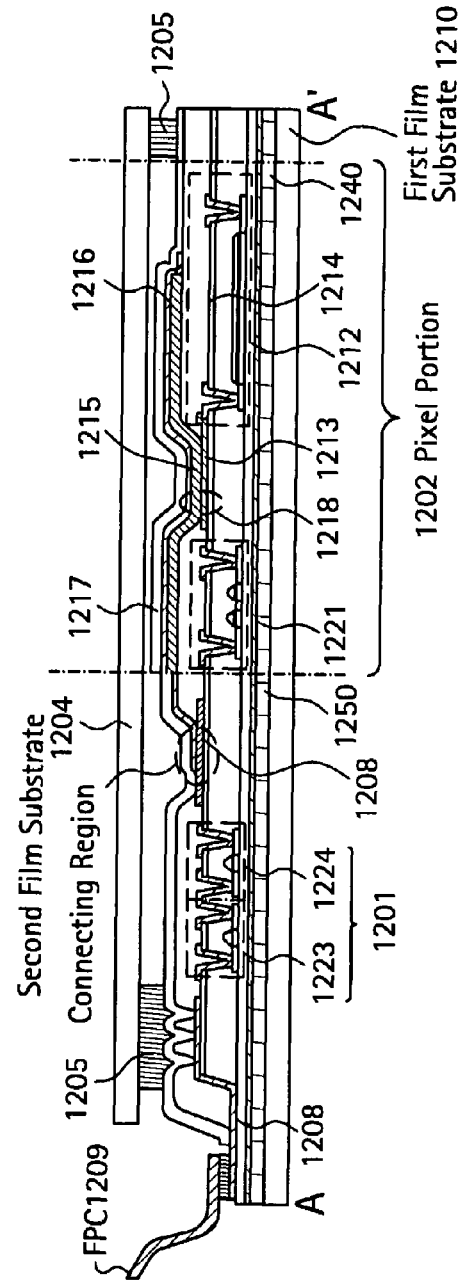

METHOD FOR MANUFACTURING SEMICONDUCTOR DEVICE

BACKGROUND OF THE INVENTION

1. Field of the Invention

The present invention relates to a method for separating a release layer. Specifically, the present invention relates to a method for separating a release layer including various devices. And more specifically, the present invention relates to an electric appliance including a display apparatus as typified by a liquid crystal module, an EL (electroluminescent) module, or the like, as one of components.

2. Related Art

In recent years, a technique for forming a TFT composed of a semiconductor thin film (with a thickness of approximately from several to several hundreds nm) formed over an insulating surface of a substrate has attracted attention. TFTs are used for an electric device such as IC, an electro-optic device, or the like, and are especially developed as a switching device or a driver circuit of a display apparatus.

In such a display apparatus, a glass substrate and a quartz substrate are generally used, however, they have disadvantages such as being fragile and heavy. In addition, the glass substrate and the quartz substrate are difficult to grow in size for mass-production. Hence, it is attempted that a TFT device is formed over a substrate having flexibility as typified by a flexible plastic film (a plastic substrate).

However, in case of using a high performance polysilicon film for the active layer of a TFT, a high temperature process at several hundreds degrees is required for a manufacturing process, so that a TFT cannot be directly formed on a plastic film.

Therefore it has already been proposed a separating method for separating a release layer, which is formed over a substrate via a separating layer, from the substrate. For example, a separation layer formed of amorphous silicon (or polysilicon) is formed, and hydrogen contained in the amorphous silicon is released by laser light irradiation through a substrate to produce a space, then the substrate is separated (See reference 1: Unexamined Patent Publication No. 10-125929). In addition, Reference 2 (Unexamined Patent Publication No. 10-125930) discloses that a liquid crystal display apparatus is completed by pasting a release layer (referred to as a transferred layer in the reference) to a plastic film by means of the technique disclosed in Reference 1.

However, the above-described method requires a substrate that is very transparent to light, and comparative large amount of laser light irradiation for energizing enough to release hydrogen contained in amorphous silicon, so that a problem becomes arisen that a release layer is damaged. In addition, according to the above described method, in case of forming a device over a separation layer and carrying out heat treatment or the like at high temperature during a manufacturing process, there is a threat that separation is inadequately carried out even if a laser light is emitted to a separation layer since hydrogen contained in the separation layer is decreased due to the heat treatment. Accordingly, processes after forming a separation layer may be restricted in order to keep the amount of hydrogen contained in the separation layer. There is the description in above references that a light-shielding layer or a reflection layer is provided in order to prevent a release layer from being damaged, in such a case, it is difficult to manufacture a transparent liquid crystal display apparatus or a light-emitting display apparatus of bottom emission type.

SUMMARY OF THE INVENTION

In view of the foregoing, it is an object of the present invention to provide a separation method for easy separation of an allover release layer with a large area. A further object of the present invention is to provide the separating method that is not subjected to restrictions in the use of substrates, such as a kind of substrate, during forming a release layer.

For solving the above described problems, the following measures are taken in the present invention.

The present invention is a separation method for easy separation of an allover release layer with a large area. Further, the present invention is the separating method that is not subjected to restrictions in the use of substrates, such as a kind of substrate, during forming a release layer. A separation method comprising the steps of forming a metal film, a first oxide, and a semiconductor film containing hydrogen in this order; and bonding a support to a release layer containing the first oxide and the semiconductor film and separating the release layer bonded to the support from a substrate provided with the metal layer by a physical means. Through the separation method, heat treatment is carried out to diffuse hydrogen contained in the semiconductor film, a third oxide is formed by reducing a second oxide formed at a surface boundary between the metal film and the first oxide film, and a film containing the second oxide and the third oxide, a surface boundary between the film containing the second oxide and the third oxide, and the metal film, or a surface boundary between the film containing the second oxide and the third oxide, and the first oxide is split.

As the metal film, an element selected from the group consisting of W (tungsten), Ti (titanium), Mo (molybdenum), Cr (chrome), Nd (neodymium), Fe (iron), Ni (nickel), Co (cobalt), Zr (zirconium), Zn (zinc), Ru (ruthenium), Rh (rhodium), Pd (palladium), Os (osmium), Ir (iridium); a single layer formed of an alloy material or a compound material each of which contains the above elements as its main components; or a lamination layer formed of these metals or mixture of these metals are used. The first oxide is formed of an insulating film such as a silicon oxide film. The second oxide is formed naturally during forming the first oxide over the metal film by sputtering, but can also be formed by thermal oxidation. The second oxide is sometimes disappeared by reductive reaction due to hydrogen contained in the first oxide. Thus, the first oxide is preferably formed not to contain hydrogen. Further, a semiconductor film containing hydrogen can be formed by CVD, and can be replaced with a nitride film containing hydrogen, since both of the films disperse hydrogen contained therein by heat treatment. Accordingly, the film that disperses hydrogen by heat treatment is preferably used since peeling is carried out by reductive reaction due to hydrogen in the present invention. The heat treatment is preferably carried out at 400° C. or more. The temperature of 400° C. is the limit of acceptable temperature for carrying out separation. In addition, heat treatment is not always necessary for crystallization of the material of the metal film, for example, molybdenum is crystallized without heat treatment.

The release layer includes an oxide film and a semiconductor film containing hydrogen. A base film is preferably formed at a surface boundary between the oxide film and the semiconductor film. As the base film, a silicon oxynitride film or a silicon nitride oxide film is preferably used.

A transistor that uses a semiconductor film as an active layer and a device that is connected to the transistor are preferably formed before separation. Given examples of the device: a semiconductor device, a light-emitting device, a liquid crystal device, or the like. Further, the separated release layer is preferably bonded to a new substrate. In case of bonding the release layer to a plastic substrate, a TFT substrate that is thin, hardly broken even if it falls, and lightweight can be formed.

The material for forming the metal film may have some defects in the crystal structure due to inside and outside factors. The valance number is various. The material becomes into various compounds by bonding to an atom of oxygen or hydrogen.

In compounds (non-stoichiometric compounds) used for the metal film such as tungsten oxide ($WO_{3-x}$), molybdenum oxide ($MoO_{3-x}$), or titanium oxide ($TiO_{2-x}$), defects are disappeared by the process of crystallographic shear (CS), that is, linkage of some octahedrons is changed from corner-sharing to edge-sharing. Based on the phenomenon of the crystallographic shear, a separation mechanism, that is, the metal film is formed of tungsten (W), and tungsten oxide (VI) ($WO_3$) is reduced to tungsten oxide (IV) ($WO_2$) by hydrogen, then, a film containing $WO_3$ and $WO_2$, or a surface boundary between the film and another film is split, will be explained. Firstly, the crystal structure of $WO_3$ and $WO_2$ will be explained. $WO_3$ has a distorted oxide rhenium structure ($AB_3$, regular octahedron) having tungsten at the body center and oxygen at six corners (FIG. 1). $WO_2$ has a distorted rutile structure in which positive ions are positioned to the corners of a square and the body center and six negative ions coordinate to the positive ion.

The non-stoichiometry of tungsten oxide is achieved by change in linkage of some octahedrons from corner-sharing into edge-sharing due to shear. The shear is occurred at a regular interval, and that is resulted that region of the rhenium structure is severed. In this regard, aggregate is formed of a plurality of octahedrons that share an edge. As just described, the phenomenon that some octahedrons in the structure are changed from corner-sharing to edge-sharing is observed in tungsten oxide. Tungsten oxide reacts tohydrogen, and becomes into tungsten oxide (V) ($W_2O_5$), $W_4O_{11}$, and further, tungsten oxide (IV) ($WO_2$), metal tungsten (W). In other words, metal tungsten reacts to hydrogen and decreased in its valence number.

By the phenomenon of crystallographic shear and the property of tungsten oxide, reductive reaction is occurred due to hydrogen that is dispersed from an upper-layered film by heat treatment at 400° C. or more, and then, the composition becomes changed. Change in composition is resulted to the change in crystal structure. Specifically, the oxide rhenium structure changes into the distorted rutile structure and the inside structure of tungsten oxide becomes distorted. Consequently, separation becomes possible. In addition, it is considered that bond is broken due to hydrogen dispersed from the upper-layered film, and a part of cohesive force is decreased, then, the inside of tungsten oxide becomes susceptible to be broken.

The present invention composed of the above described constitution, TFT or the like can be formed over a flexible film substrate with good yields since the whole surface separation can be carried out. According to the present invention, there is no stress on TFT or the like. A light-emitting apparatus, a liquid crystal display apparatus, and another display apparatus are thin and hardly broken even if they fall. Further, display an image on a curved surface or unusual shape becomes possible. According to the present invention, a support or the like can be reused and low cost film substrate is used, so that the cost of a display apparatus can be reduced by the synergistic effect.

The TFT formed according to the present invention can be employed in a light-emitting apparatus of top-emission, bottom-emission, and dual-emission, liquid crystal display apparatus of transparent type, reflective type, and translucent type, or the like.

BRIEF DESCRIPTION OF THE DRAWINGS

FIG. 2 is a view showing a crystal structure of tungsten oxide;

FIGS. 18A and 18B are an external view and a cross-sectional view of a light-emitting apparatus;

DESCRIPTION OF THE PREFERRED EMBODIMENTS

Embodiment of the present invention will be described with reference to FIG. 3.

Figure 1:
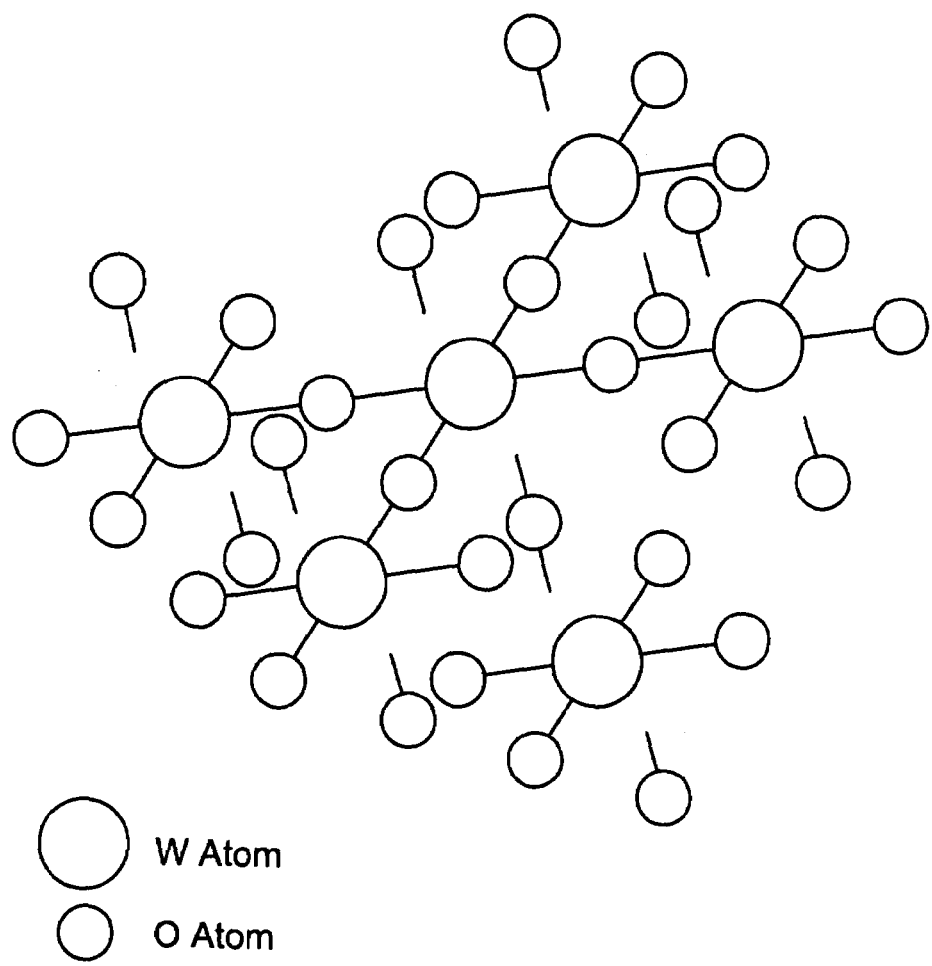
FIG. 1 is a view showing a crystal structure of tungsten oxide.
Figure 3A:
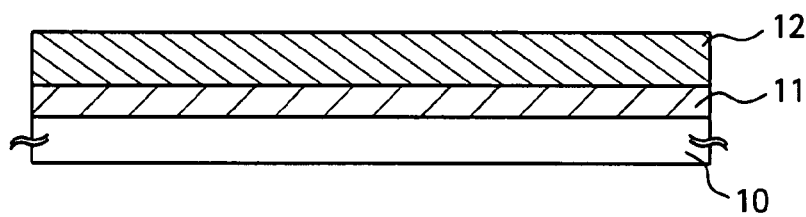
FIGS. 3A to 3E are explanatory views showing a separation process.

A metal film 11 is deposited over a first substrate 10 (FIG. 3A). The first substrate (a support substrate) 10 has only to have rigidity enough to withstand a following separation process, for example, a glass substrate, a quartz substrate, a ceramic substrate, a silicon substrate, a metal substrate, or a stainless substrate can be used. As the metal film 11, a single layer or a laminated layer can be used that is formed of an element selected from the group consisting of W, Ti, Ta, Mo, Nd, Ni, Co, Zr, Zn, Ru, Rh, Pd, Os, or Ir; or an alloy material or a compound material, each of which contains the above described elements as its main component. The thickness of the metal film 11 is from 10 to 200 nm, preferably, from 50 to 75 nm. A metal nitride film can be used instead of the metal film 11.

The metal film 11 is deposited by face down sputtering, so that the thickness of the periphery of the first substrate 10 is susceptible to be uneven. Therefore the film of a periphery portion is preferably removed, and an insulating film such as an oxynitride silicon film with a thickness approximately of 100 nm may be formed between the substrate 10 and the metal film 11 to prevent the support substrate from being etched back.

Subsequently, a release layer 12 is formed over the metal film 11. The release layer 12 has a first oxide 12a and a semiconductor film 12b including hydrogen. As the first oxide, silicon oxide, silicon oxynitride, or the like may be formed by sputtering, CVD. The thickness of the first oxide is preferably to be twice as that of the metal film 11. Here, a silicon oxynitride film is deposited to have a thickness of from 150 to 200 nm by sputtering using a silicon target. A semiconductor may be provided with a TFT, an organic TFT, a thin film diode, a pin junction photoelectric transfer device formed of silicon, a silicon resistance device, a sensor device (typically, a pressure sensitive fingerprint sensor), or the like. A base film formed of silicon nitride or the like is preferably formed over the reverse side of the semiconductor film included in the release layer 12 to shut out impurities or dust from the metal film 11 or the first substrate (a support substrate) 10.

A second oxide 17 exists between the metal film 11 and the release layer 12. The second oxide is formed simultaneously with forming the first oxide in the release layer 12. Taking tungsten as an example, it can be considered that tungsten oxide ($WO_x$, the second oxide) is formed by preferential oxidation reaction of oxygen with tungsten occurred at a very early stage during depositing the silicon oxide film (the first oxide) by sputtering. Then, the second oxide (for example, $WO_3$) is reduced to form a third oxide (for example, $WO_2$), and a film containing the second oxide and third oxide, or a surface boundary between another film is separated. Therefore, if the first oxide contains hydrogen, the reductive reaction is occurred in the second oxide, so that there is a threat that the second oxide is inhibited of its formation. Consequently, the first oxide is preferably formed not to contain hydrogen. Specifically, when the second oxide contains hydrogen in case of being formed by CVD, so that it is better not to use CVD.

Then, heat treatment is carried out at a temperature more than 400° C. The heat treatment causes reductive reaction in the second oxide, since hydrogen, which is contained in the release layer 12, especially in a semiconductor, is diffused into another film. In addition, according to the heat treatment, a part of or all of the second oxide is crystallized. The heat treatment can be carried out together with another manufacturing process to reduce the number of processes. For example, in case that an amorphous semiconductor is formed to form a polycrystalline semiconductor by a heating furnace or laser irradiation, hydrogen can be diffused simultaneously with crystallizing the amorphous semiconductor by a heat treatment of at least 500° C.

Figure 3B:
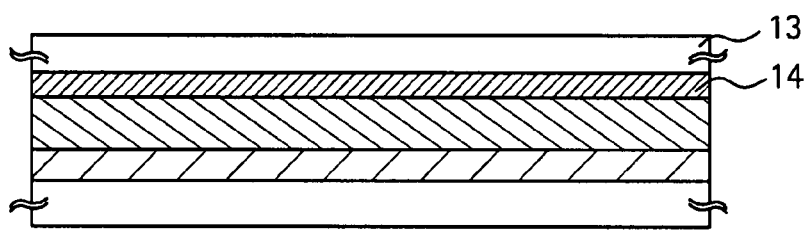

Then, a second substrate 13 for supporting the release layer 12 is bonded with a first adhesive 14 (FIG. 3B). The rigidity of the second substrate 13 is preferably higher than that of the first substrate 10. As the first adhesive 14, a bonding agent, a two-sided tape, or the like, such as the adhesive that is peeled by UV light, the adhesive that is peeled by heat, or the adhesive that is soluble in water can be used.

Figure 3C:
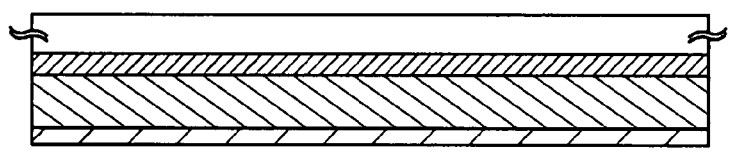

The first substrate 10 provided with the metal film 11 is separated by a physical means (FIG. 3C). The first substrate 10 is separated by splitting a film containing the second or third oxide, or a surface boundary with another film. According to this, the release layer 12 is separated from the first substrate 10.

Figure 3D:
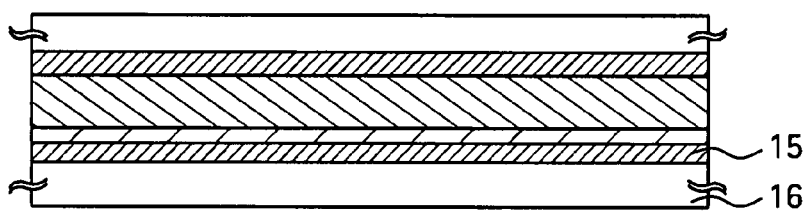

The separated release layer 12 is pasted to a third substrate 16 that becomes a transferred body with a second adhesive 15 (FIG. 3D). As the second adhesive 15, a UV cured resin, specifically, an epoxy resin adhesive, a resin additive adhesive, a two sided tape, or the like can be used. As the third substrate 16, a flexible substrate having a thin film thickness (a film substrate), that is, a plastic substrate such as polycarbonate, poly arylate, polyethersulfone, or the like; a Teflon substrate; a ceramic substrate; or the like is used.

Figure 3E:
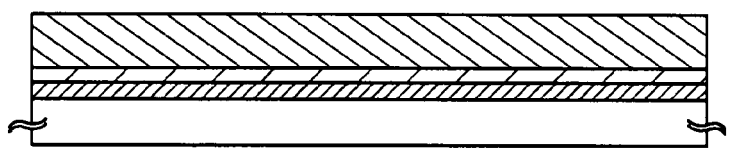

Next, the second substrate 13 is separated by removing the first adhesive 14 (FIG. 3E). Specifically, the first adhesive 14 can be separated by UV light irradiation, heating, or water washing. Further, plasma cleaning with Ar gas or $O_2$ gas, or bellclean is preferably carried out.

According to this, a TFT or the like formed over the film substrate that is prepared as described above can be used for a semiconductor device of a light-emitting apparatus or a liquid crystal display apparatus. For example, a light-emitting device is formed over the release layer 12, and a protective film that will serve as a sealing member, then, a light-emitting apparatus is completed. In order to form a light-emitting device over the release layer 12, a film substrate provided with TFTs is fixed to a glass substrate with a tape since the film substrate is flexible, and each light-emitting layer can be formed by vapor deposition. Note that a light-emitting layer, an electrode, a protective film, and the like are preferably formed continuously without exposing to the atmosphere. The light-emitting apparatus can be, but not exclusively, manufactured in this order, that is, the light-emitting device is formed over the release layer, the second substrate is bonded, and the release layer having the light-emitting device is separated and pasted to the film substrate that serves as the third substrate.

A liquid crystal display apparatus may be, but not exclusively, manufactured in this order, that is, a second substrate is separated, an opposite substrate is bonded with a sealant, and a liquid crystal material is injected. The liquid crystal display apparatus can be manufactured in another order, that is, the second substrate is bonded as the opposite substrate, the third substrate is bonded, and the liquid crystal material is injected. Spacers may be formed or dispersed in order to keep the space between substrates when a liquid crystal display apparatus is manufactured. In case of the flexible substrate, three times as many as spacers are preferably formed or dispersed.

According to the above described processes, thin films are deposited sequentially, and oxide formed at the surface boundary between the metal film and the oxide film are reduced and crystallized by heat treatment at 400° C. or more, then, the oxide is separated by splitting the film that contains the oxide or the surface boundary between the film that contains the oxide and another film.

According to the present invention composed of the above described constitution, TFT or the like can be formed over a flexible film substrate with good yields since the whole surface separation can be carried out. According to the present invention, there is no stress on TFT or the like. A light-emitting apparatus, a liquid crystal display apparatus, and another display apparatus are thin and hardly broken even if they fall. Further, display an image on a curved surface or unusual shape becomes possible. According to the present invention, a support or the like can be reused and low cost film substrate is used, so that the cost of a display apparatus can be reduced.

EXAMPLE 1

As shown in above described embodiment, the experiment that is demonstrated the fact that thin films are deposited sequentially, and oxide formed at a surface boundary between the metal film and the oxide film are reduced by heat treatment at 400° C. or more, then, the film containing the oxide or a surface boundary between the film and another film is split will be explained hereinafter. In the following experiment, a tungsten film is used as the metal film, a silicon oxide film as the oxide film included in the release layer, and an amorphous silicon film is used as the semiconductor film.

Experiment 1

AN 100 glass substrate (126×126 mm) as a substrate, a tungsten (W) film (50 nm) deposited by sputtering as a metal film, a silicon oxide film (200 nm) deposited by sputtering as a protective film, a silicon oxynitride (SiON) film (100 nm) deposited by CVD as a base film, and an amorphous silicon film (54 nm) deposited by CVD as a semiconductor film are sequentially formed. Thereafter, samples 1 to 6, each of which are heat treated for 1 hour at 500° C., 450° C., 425° C., 410° C., 400° C., and 350° C., and a sample 7, which is heat treated for 1 hour at 350° C. in the hydrogen atmosphere are prepared. Then, separation experiments are respectively carried out to the samples 1 to 7 using a polytetrafluoroethylene tape. FIGS. 4A to 4G are photographs of the experiments.

As shown in FIGS. 4A to 4G, samples 1 to 4, which are heat treated at 410° C. or more can be separated, however, samples 5 and 6 cannot be separated, that is, a semiconductor film or the like does not adhere to the polytetrafluoroethylene tape.

Figure 4A:
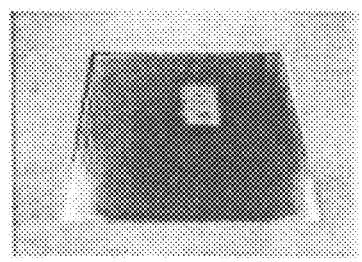
FIGS. 4A to 4K are photographs showing experimental results.
Figure 4B:
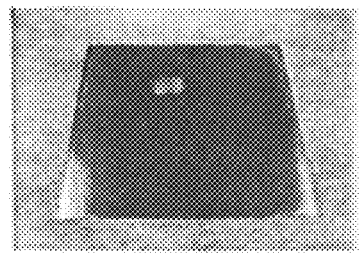
Figure 4C:
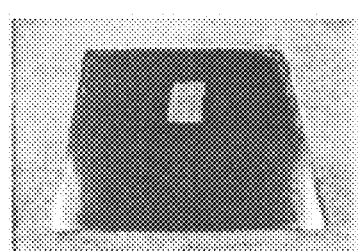
Figure 4D:
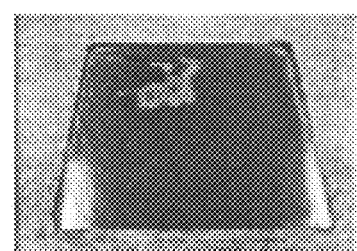
Figure 4E:
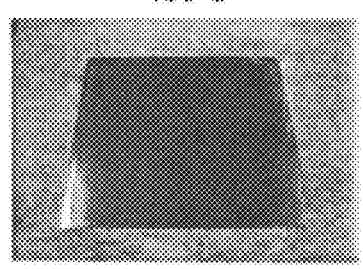
Figure 4F:
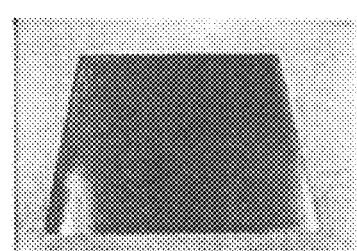
Figure 4G:
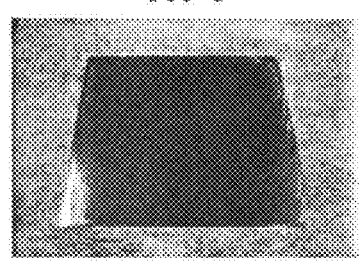
Figure 4H:
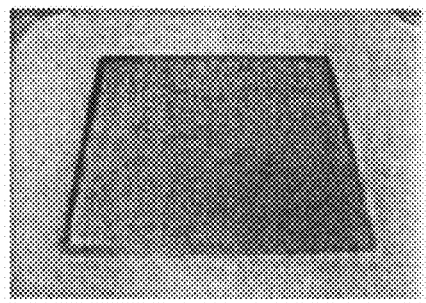
Figure 4I:
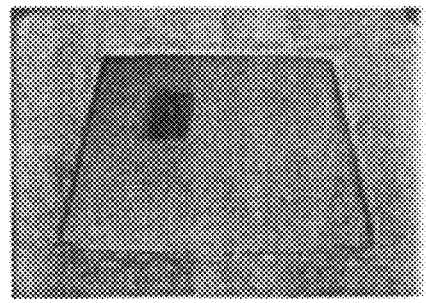
Figure 4J:
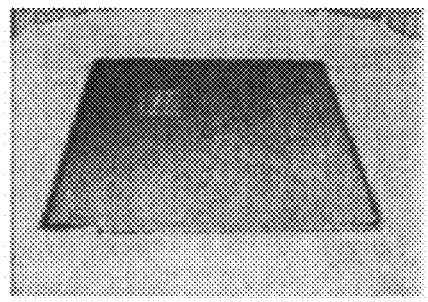
Figure 4K:
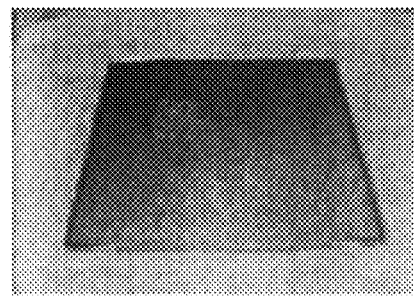

FIGS. 4H and 4I are photographs showing both cases that heat treatment for 1 hour at 500° C. and separation are carried out, and heat treatment for 1 hour at 500° C. and for 4 hours at 550° C. and separation are carried out as in the samples of 1 to 7 with respect to a sample 8 provided with a semiconductor film. FIGS. 4J and 4K are photographs showing both cases that heat treatment for 1 hour at 500° C. and separation are carried out, and heat treatment for 1 hour at 500° C. and for 4 hours at 550° C. and separation are carried out with respect to a sample 9 provided with a silicon nitride (SiN) film (100 nm) instead of a semiconductor film by CVD. As shown in FIGS. 4H to 4K, separation is carried out to the case that heat treatment is carried out at for long hours 500° C. or more. Further, separation is carried out when either an amorphous semiconductor film or a silicon nitride film deposited by CVD is formed over the protective film.

According to the experiment, separation is carried out in case that heat treatment is carried out at 400° C. or more, and a film is deposited by CVD over the base film. In other words, the temperature of 400° C. is the limit of acceptable temperature for carrying out separation.

Experiment 2

Figure 5A:
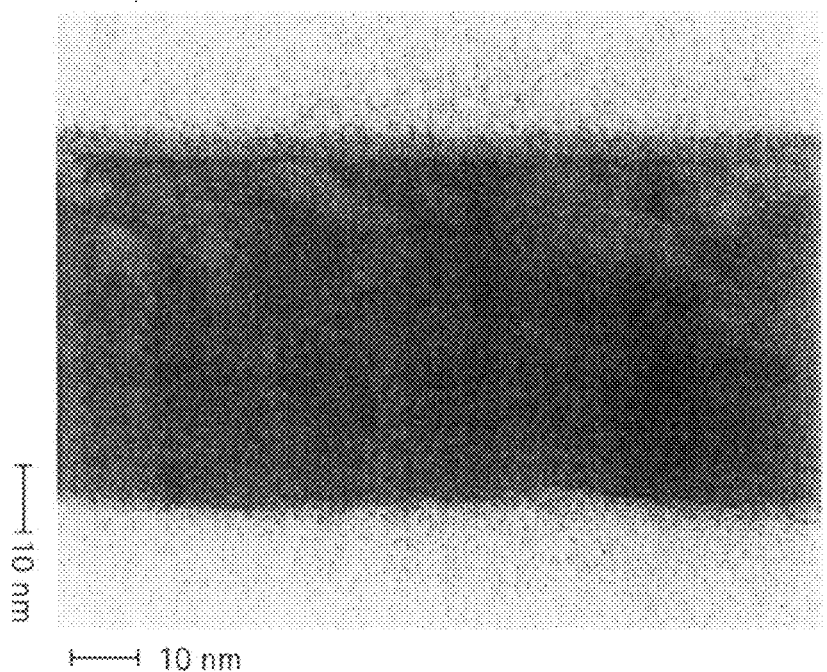
FIGS. 5A and 5B are TEM images.
Figure 5B:
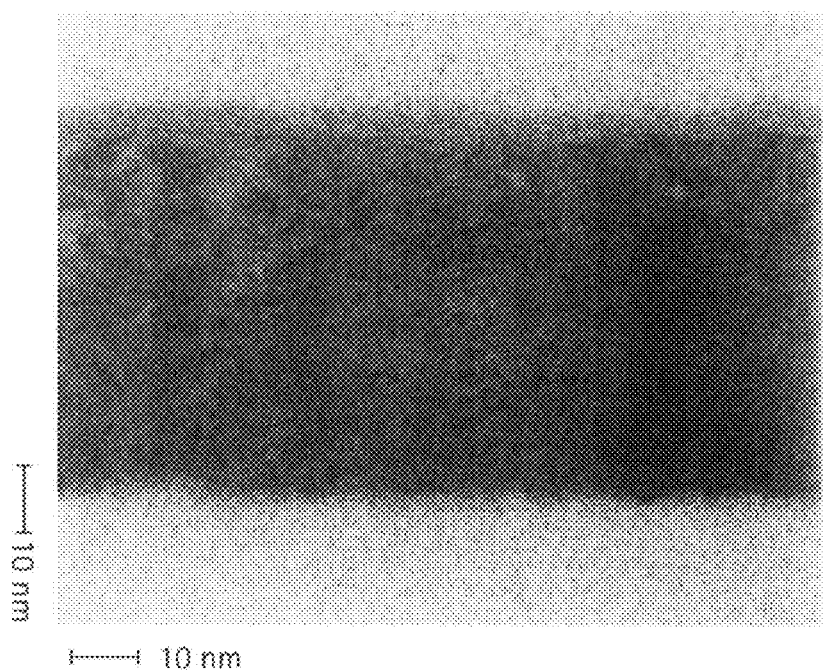
Figure 6A:
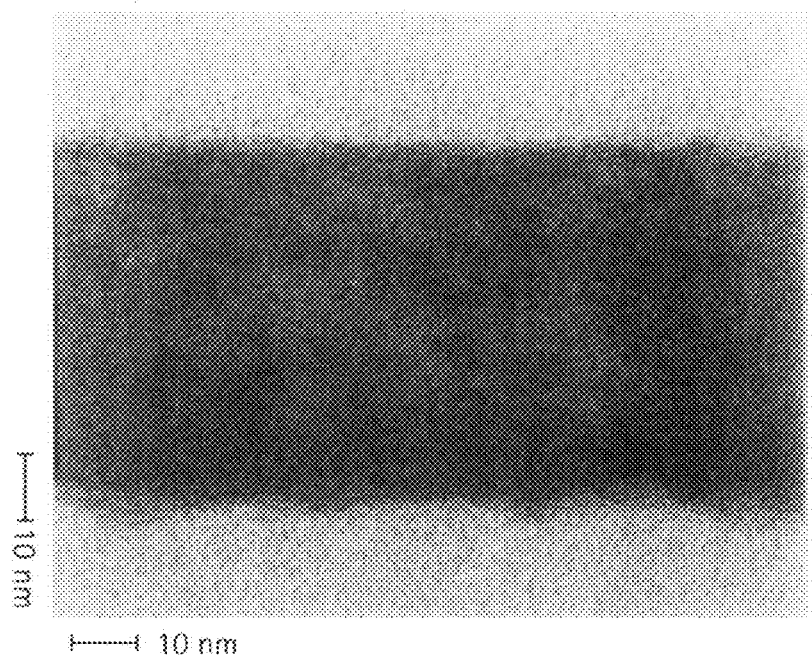
FIGS. 6A and 6B are a TEM image and a frame format of the TEM image.
Figure 6B:
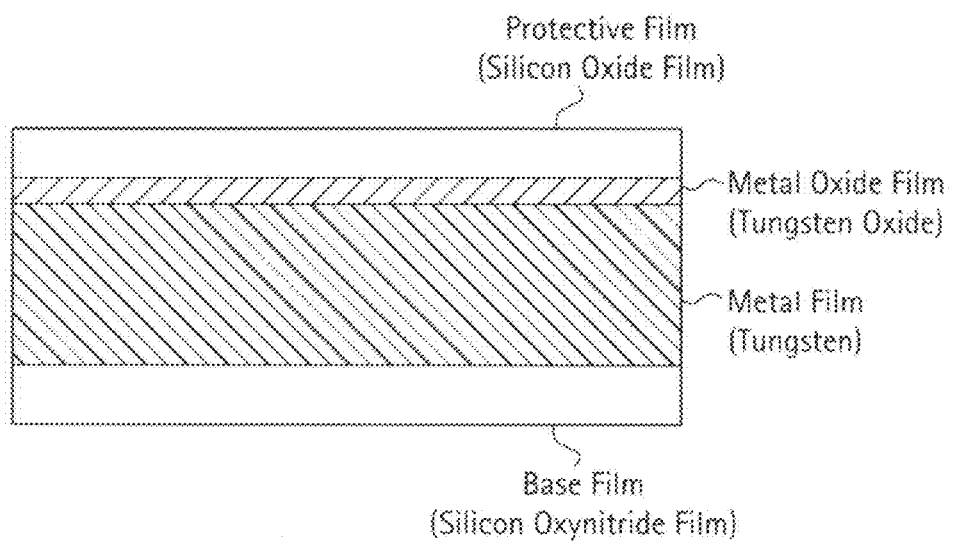

As in the case with the experiment 1, AN 100 glass substrate (126×126 mm) as a substrate, a tungsten film (50 nm) deposited by sputtering as a metal film, a silicon oxide film (200 nm) deposited by sputtering as a protective film, a silicon oxynitride (SiON) film (100 nm) deposited by CVD as a base film, and an amorphous silicon film (54 nm) deposited by CVD as a semiconductor film are sequentially formed. A sample A that is not heat treated, a sample B that is heat treated for 1 hour at 220° C., and a sample C that is heat treated for 1 hour at 500° C., and further, for 4 hours at 550° C. are prepared and TEM analysis is carried out. FIGS. 5A, 5B, and 6A are each TEM image, and FIG. 6B is a view showing the frame format of each of the TEM image.

As shown in all TEM images, a new film (hereinafter, unknown film) is formed at a surface boundary between the tungsten film and the silicon oxide film. Compared with TEM images each other, only the unknown film of the sample C has a crystal lattice arranged in a specific direction. The thickness of the unknown films of the samples A and B are approximately 3 nm, but the thickness of the unknown film of the sample C is slightly thinner than those of the samples A and B. Further, the samples A to C are tried to be separated by a physical means such as a tape and only sample C can be separated.

According to the experiment 2, an unknown film is formed at a surface boundary between the tungsten film and the silicon oxide film. By carrying out heat treatment at 500° C. or more as in the case with the sample C, the unknown film is crystallized. When the unknown film has crystallinity, the sample becomes possible to be separated. The thickness of the unknown film is uneven. Only the thickness of the unknown film of the sample C that is capable of being separated is slightly thin. Therefore, it is considered that whether the sample is possible to be separated or not is related to the crystallinity and the thickness of the unknown film.

A table 1 is a quantitative measurement result by EDX for specifying the composition of the unknown films, which are found by above TEM images, in the samples A to C.

TABLE 1

|  | Element | Number of counts | wt % | atom % |
|---|---|---|---|---|
| Sample A | O | 48 | 6.26 | 43.40 |
|  | W | 1277 | 93.74 | 56.60 |
| Sample B | O | 88 | 7.92 | 49.71 |
|  | W | 1816 | 92.08 | 50.29 |
| Sample C | O | 62 | 8.90 | 52.88 |
|  | W | 1127 | 91.10 | 47.12 |

As shown in the table 1, the unknown film is composed of tungsten (W) and oxygen (O). Therefore the unknown film is composed of $WO_x$ (tungsten oxide) containing tungsten mainly as its components. By the quantitative measurement result, a ratio of W to O of composition is W>O in the samples A and B, and a ratio of W to O of composition is W<O in the sample C.

According to the above experiment, a new film is formed at a surface boundary between the tungsten film (metal film) and the silicon oxide film (protective film). The film is formed of tungsten oxide containing tungsten as its main components. The composition ratios are different between the samples A, B and the sample C.

Experiment 3

Figure 7A:
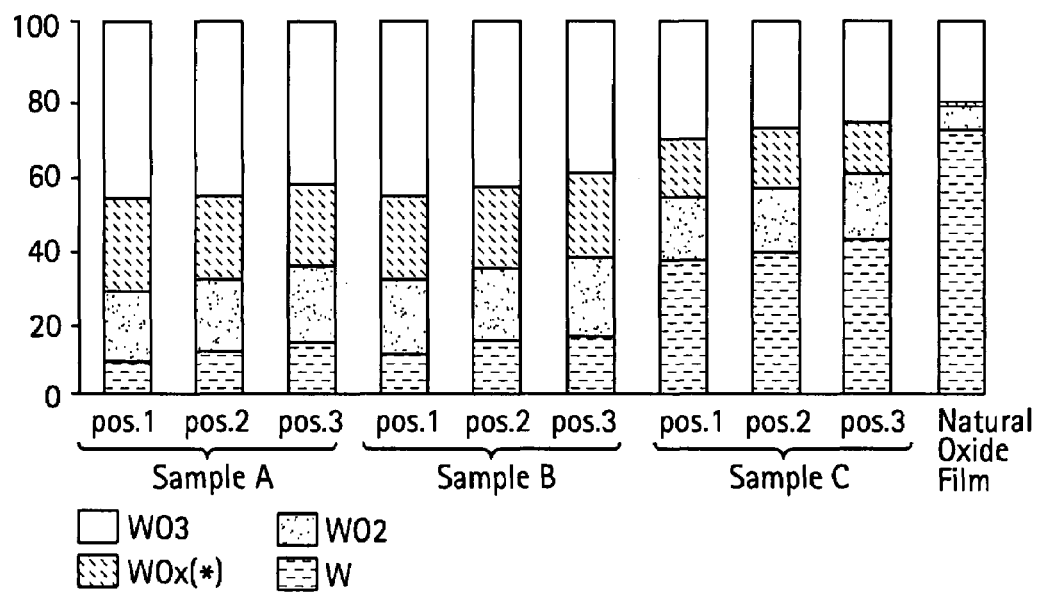
FIGS. 7A and 7B are views showing a composition result of a film by XPS.
Figure 7B:
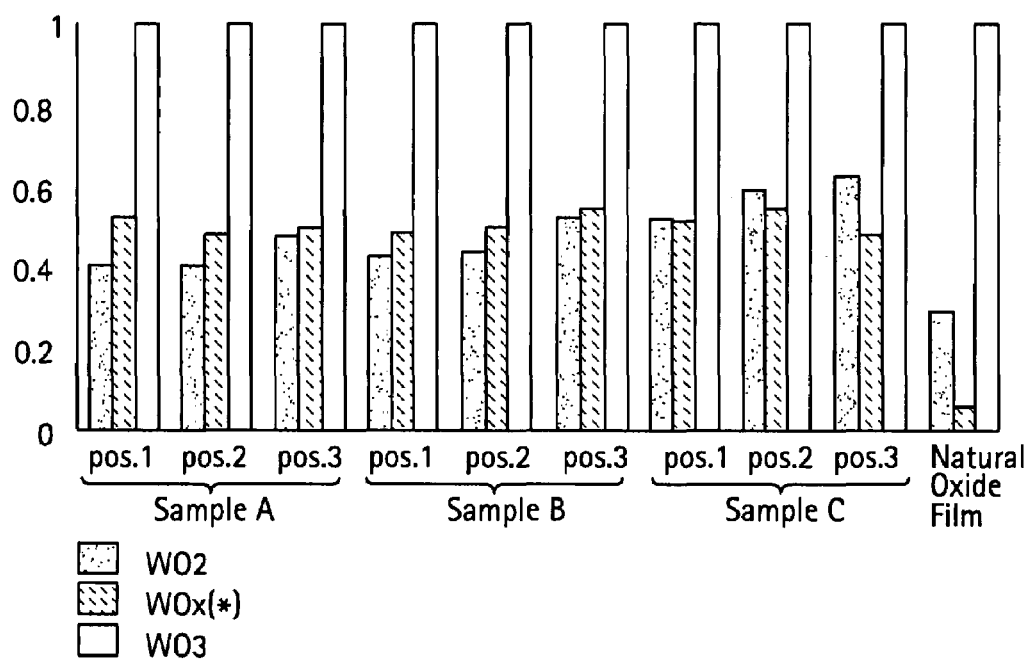

The composition of the tungsten oxide film in the samples A to C formed as in the case with the experiment 2 and the composition ratio of the tungsten film that is oxidized naturally as a comparison sample are studied in an experiment 3 using XPS (X-ray Photoelectron Spectroscopy). A table 2 shows the result, and FIG. 7B shows the result in a bar graph. The table 3 shows a result of intensity of $WO_2$ and $WO_x$ in case that $WO_3$ is normalized by 100% with respect to the data in the result shown in the table 2. FIG. 7A is a bar graph showing the result. In this experiment, the internal of the unknown film is exposed by ion sputtering; let the case that tungsten is detected 1 (atomic %) be Pos. 1; 2 (atomic %), Pos. 2; and 3 (atomic %), Pos. 3; and the composition in depth is detected. The composition ratios of tungsten (W), tungsten oxide (IV) ($WO_2$), tungsten oxide ($WO_x$, 2<X<3), tungsten oxide (IV) ($WO_2$) are detected with respect to each depth of Pos. 1 to 3. In-depth ion sputtering is carried out to sample A at 4.25 minutes after, 4.5 minutes after, and 4.75 minutes after; to sample B at 4.0 minutes after, 4.25 minutes after, and 4.5 minutes after; and to sample C at 5.0 minutes after, 5.25 minutes after, and 5.5 minutes after, respectively, and each of which corresponds to Pos. 1 to 3 in each the samples A to C.

As used herein, "tungsten oxide (WO$_x$)" denotes WO$_2$, WO$_3$, W$_2$O$_5$, W$_4$O$_{11}$, W$_2$O$_3$, W$_4$O$_3$, W$_5$O$_9$, W$_3$O$_8$, or the like. Further, the term "naturally oxidized film" denotes a tungsten film which is formed over a base film on a glass substrate, and which is left in the atmosphere.

TABLE 2

| | Depth | Tungsten (W) | Tungsten Oxide (WO$_2$) | Tungsten Oxide (WO$_x$) | Tungsten Oxide (WO$_3$) |
|---|---|---|---|---|---|
| Sample A | Pos. 1 | 9.57 | 18.91 | 24.58 | 46.94 |
| | Pos. 2 | 12.54 | 18.83 | 22.19 | 46.44 |
| | Pos. 3 | 14.45 | 20.49 | 21.49 | 43.57 |
| Sample B | Pos. 1 | 11.32 | 19.68 | 22.42 | 46.58 |
| | Pos. 2 | 14.57 | 19.15 | 21.91 | 44.38 |
| | Pos. 3 | 15.46 | 21.2 | 22.17 | 41.18 |
| Sample C | Pos. 1 | 35.51 | 16.37 | 16.13 | 32 |
| | Pos. 2 | 37.44 | 17.2 | 15.8 | 29.57 |
| | Pos. 3 | 40.94 | 17.43 | 13.3 | 28.33 |
| Natural Oxide Film | | 69.54 | 6.42 | 1.03 | 23.01 |

TABLE 3

| | Depth | Tungsten Oxide (WO$_2$) | Tungsten Oxide (WO$_x$) | Tungsten Oxide (WO$_3$) |
|---|---|---|---|---|
| Sample A | Pos. 1 | 40.29% | 52.36% | 100.00% |
| | Pos. 2 | 40.55% | 47.78% | 100.00% |
| | Pos. 3 | 47.03% | 49.32% | 100.00% |
| Sample B | Pos. 1 | 42.25% | 48.13% | 100.00% |
| | Pos. 2 | 43.15% | 49.37% | 100.00% |
| | Pos. 3 | 51.48% | 53.48% | 100.00% |
| Sample C | Pos. 1 | 51.16% | 50.41% | 100.00% |
| | Pos. 2 | 58.17% | 53.43% | 100.00% |
| | Pos. 3 | 61.52% | 46.95% | 100.00% |
| Natural Oxide Film | | 27.90% | 4.48% | 100.00% |

As shown in FIG. 7A and the table 2, the composition ratio of tungsten (W) is approximately 10 and several % in the samples A and B, though the composition ratio of tungsten (W) is at least 35% in depth in the sample C. The composition ratio of tungsten oxide (WO$_3$) is approximately 45% in the samples A and B, though the composition ratio of tungsten oxide (WO$_3$) is approximately 30% in depth in the sample C. Compared with the composition ratio between the samples A to C and naturally oxidized film, the ratio of WO$_x$ in the naturally oxidized film is extremely small.

As shown in FIG. 7B and the table 3, in which tungsten oxide (WO$_3$) is 100%, the ratio of tungsten oxide (WO$_x$) is slightly higher than that of tungsten oxide (WO$_2$) in the samples A and B, though the ratio of tungsten oxide (WO$_2$) is slightly higher than that of tungsten oxide (WO$_x$) in the sample C. Thus, it can be considered that the composition of tungsten oxide is changed by heat treatment.

According to this experiment, tungsten oxide is formed having a composition ratio that is different from natural oxidation during forming a silicon oxide film. Compared with the composition between the samples A, B and the sample C, the ratio of tungsten is high and tungsten is low. Thus, in oxide in the sample C, it can be considered that the composition is changed due to some sort of reaction by heat treatment. It can be considered that differences among the samples A to C are the temperature of heat treatment, and the change in composition of a metal oxide film in the sample C due to reductive reaction by heat treatment at 400° C. or more based on the results of experiments 1 and 2. According to this, the fact that composition is changed corresponds to the fact that the crystal structure is different.

Experiment 4

Figure 8:
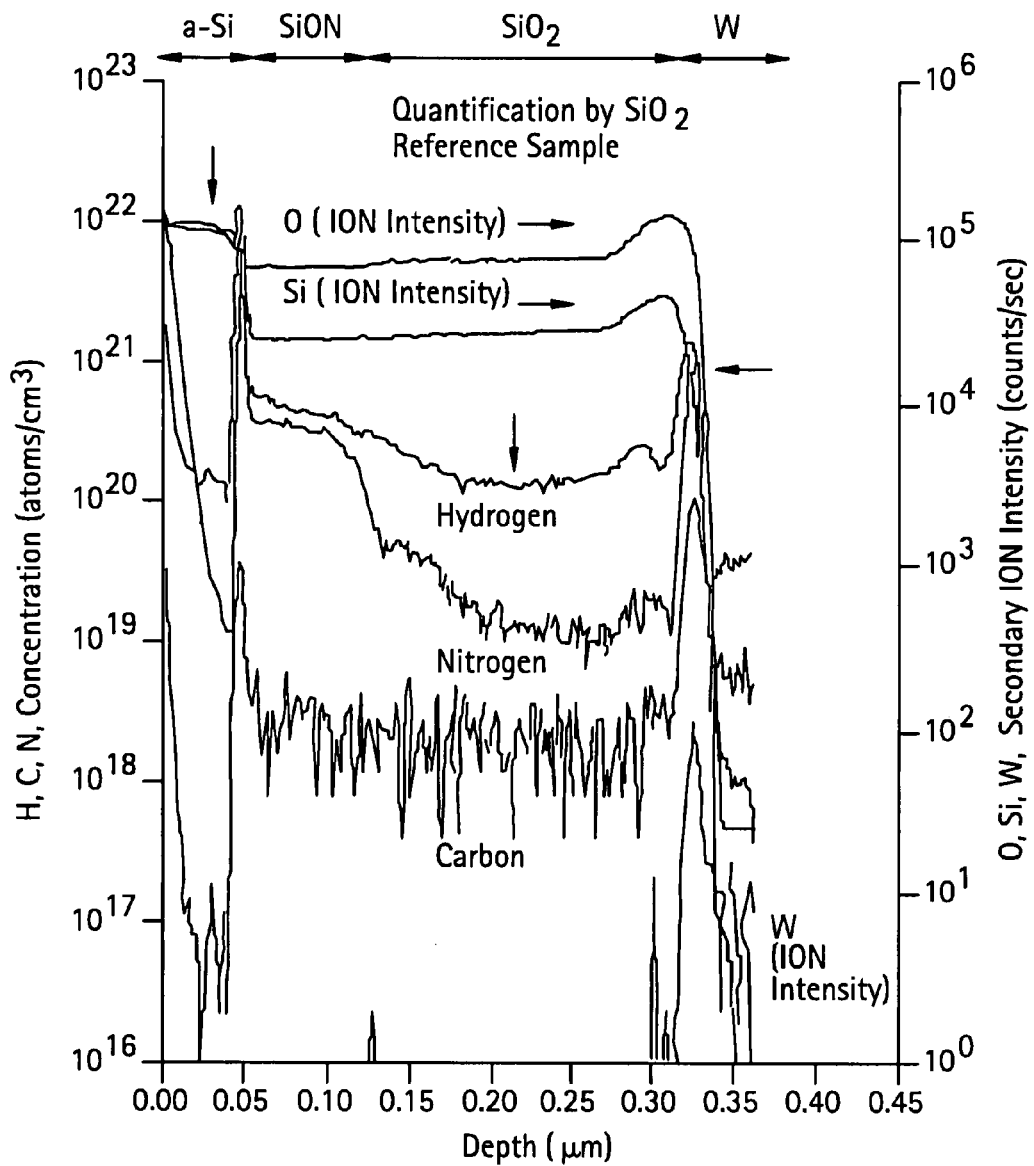
FIG. 8 is a view showing a profile by SIMS.
Figure 9:
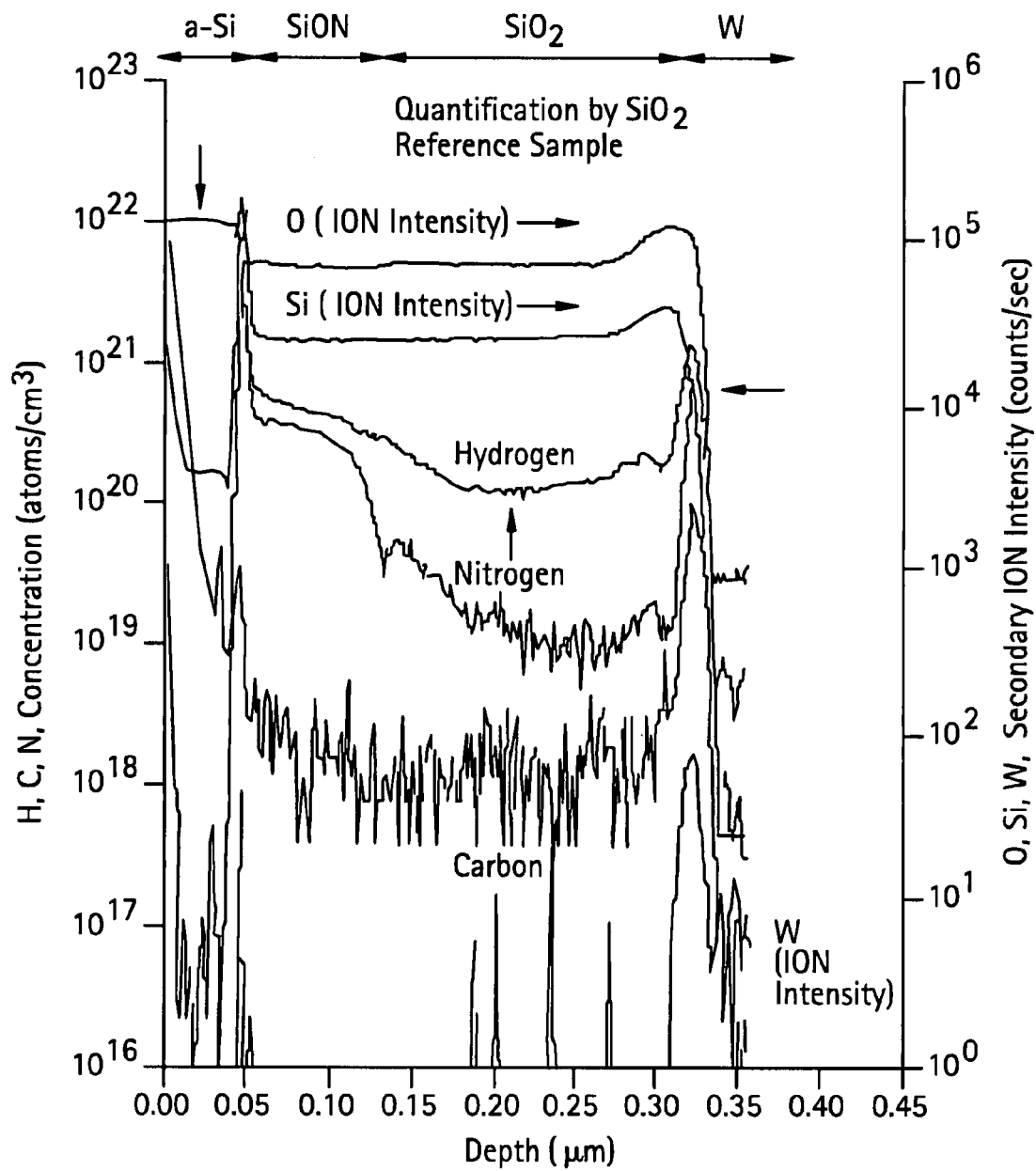
FIG. 9 is a view showing a profile by SIMS.
Figure 10:
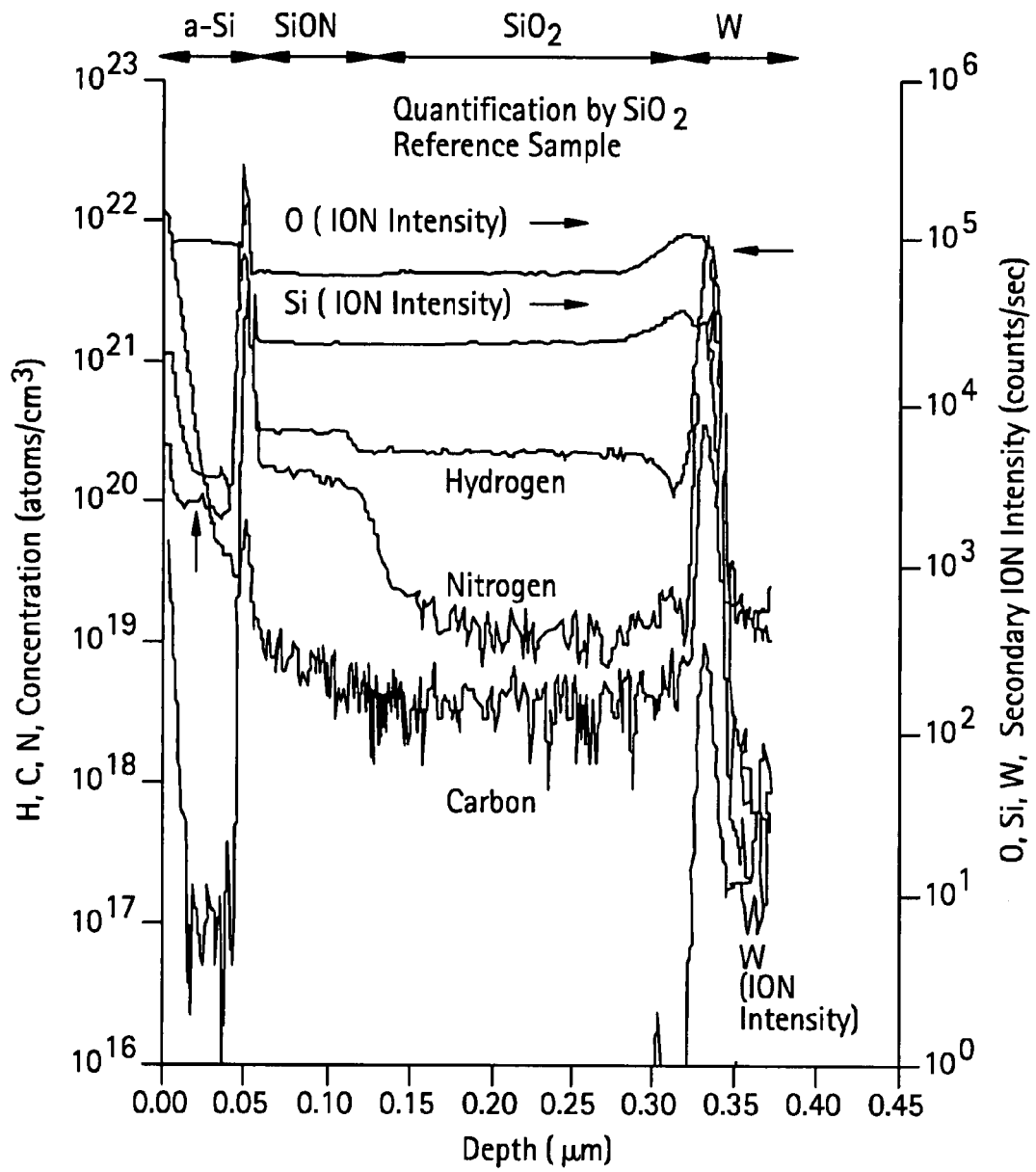
FIG. 10 is a view showing a profile by SIMS.

FIGS. 8 to 10 are views showing SIMS (secondary ion mass spectrometry) profile with respect to the sample A to C used in the experiment 2.

Look at the profile of hydrogen (H) in an amorphous silicon film (a-Si), the concentration of hydrogen in the samples A, B is approximately 1.0×10$^{22}$ (aroms/cm$^3$), and the concentration of hydrogen in the sample C is approximately 1.0×10$^{20}$ (aroms/cm$^3$), that is, the concentration of hydrogen in the sample C is two orders of magnitude less than that in the samples A, B. By observing hydrogen profile in a silicon oxynitride film (SiON) and a silicon oxide film (SiO$_2$), the hydrogen in the samples A, B is decreased in the vicinity of 0.2 μm in depth. The concentration distribution is uneven. On the other hand, the sample C shows no signs of a prominent decrease, and the concentration distribution is even in depth. Therefore, in the sample C, hydrogen is dispersed evenly in depth in the silicon oxynitride film and the silicon oxide film. Next, look at the concentration of nitride at the surface boundary between a silicon oxide film and a tungsten film (W), the concentration of nitride in the samples A, B is approximately 1.0×10$^{21}$ (aroms/cm$^3$), and the concentration of nitride in the sample C is approximately 6.5×10$^{21}$ (aroms/cm$^3$). Therefore, as shown in the experiment 2, the composition of the unknown film over the surface boundary between the silicon oxide film and the tungsten film in the sample C is different from that in the samples A, B.

Figure 11:
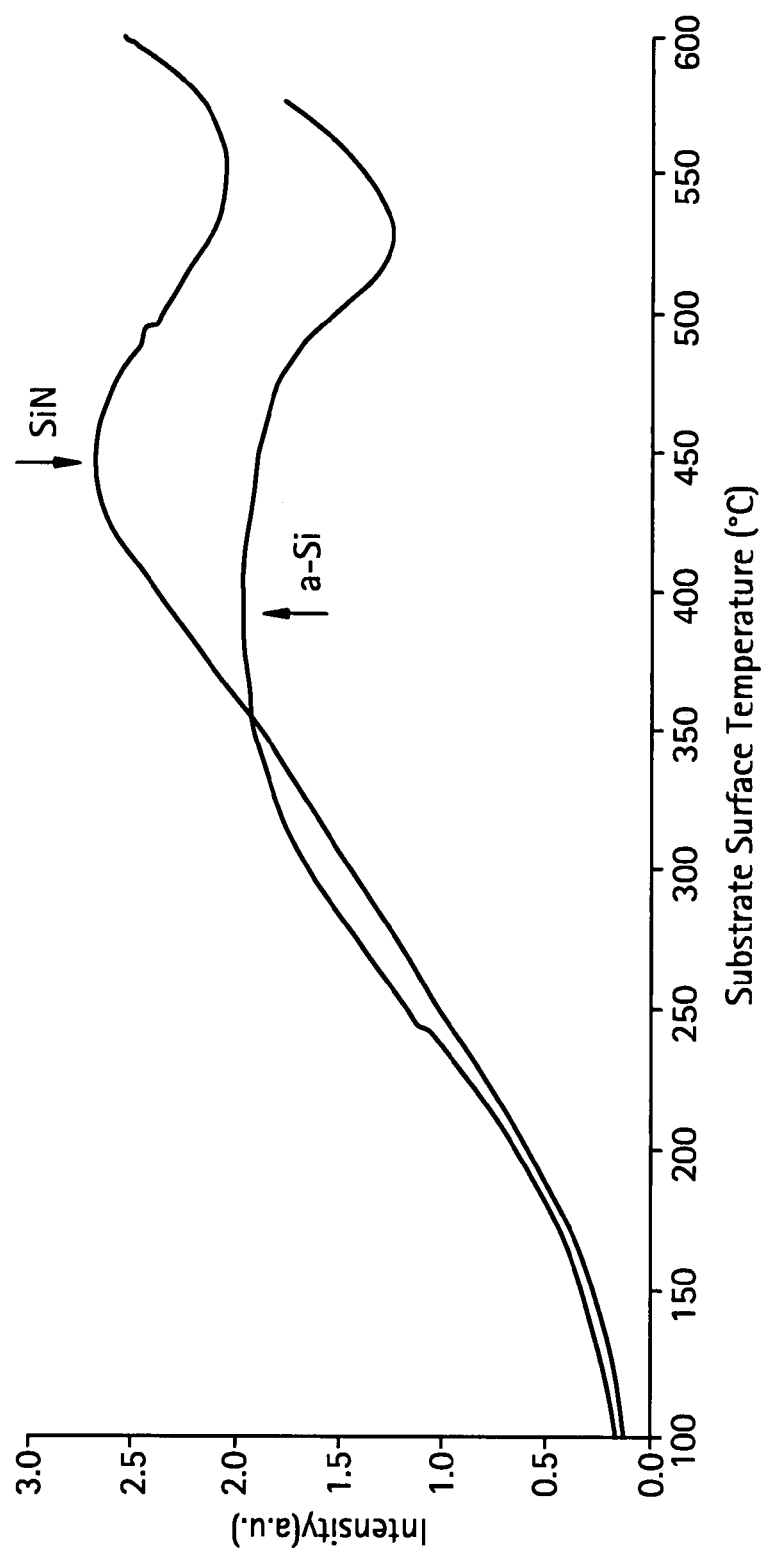
FIG. 11 is a view showing a result by TDS.

On the other hand, FIG. 11 is a graph showing the relationship between the density of desorbed hydrogen from an amorphous silicon film (a-Si) formed over a glass substrate and a substrate surface temperature (° C.) by Thermal Desorption Spectroscopy (TDS). As shown in FIG. 11, hydrogen desorbing from the amorphous silicon film is increased depending on an increase in a substrate temperature. That is, hydrogen desorbs from the amorphous silicon film due to heat treatment at 400° C. or more. Therefore it can be considered that hydrogen in the amorphous silicon film is dispersed to another film by heat treatment at 400° C.

FIG. 11 shows the relationship between the density of desorbed hydrogen from a silicon nitride film (SiN) and a substrate surface temperature. As shown in FIG. 11, the hydrogen desorbed from the silicon nitride film (SiN) is increased depending on an increase in the substrate temperature.

Based on the results from SIMS and TDS, hydrogen in the amorphous silicon film is dispersed due to heat treatment at 400° C. or more in the sample C. Tungsten oxide (VI) (WO$_3$) reacts to hydrogen, and becomes into tungsten oxide (V) (W$_2$O$_5$), W$_4$O$_{11}$, and further, tungsten oxide (IV) (WO$_2$), metal tungsten (W). According to this, reductive reaction is occurred in the oxide of the sample C by hydrogen in the amorphous silicon film that is dispersed by heat treatment at 400° C. or more. As shown in FIG. 7, the composition of the sample C is different from that of another sample.

Experiment 5

Figure 12A:
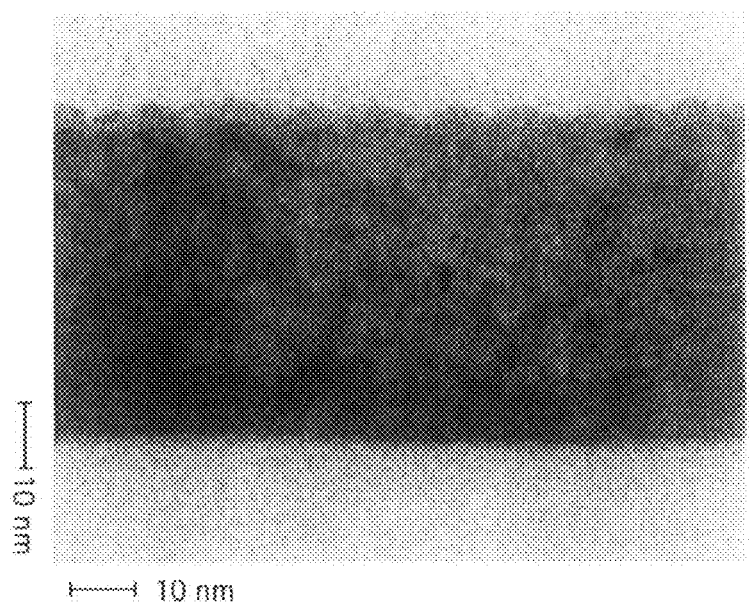
FIGS. 12A and 12B are a TEM image and a frame format of the TEM image.
Figure 12B:
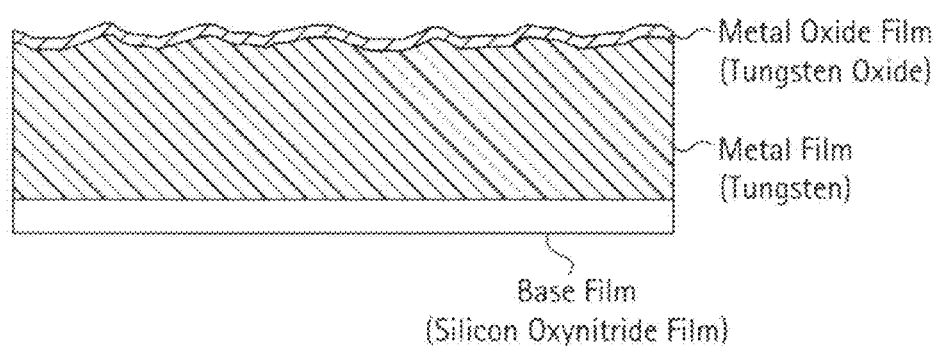
Figure 13A:
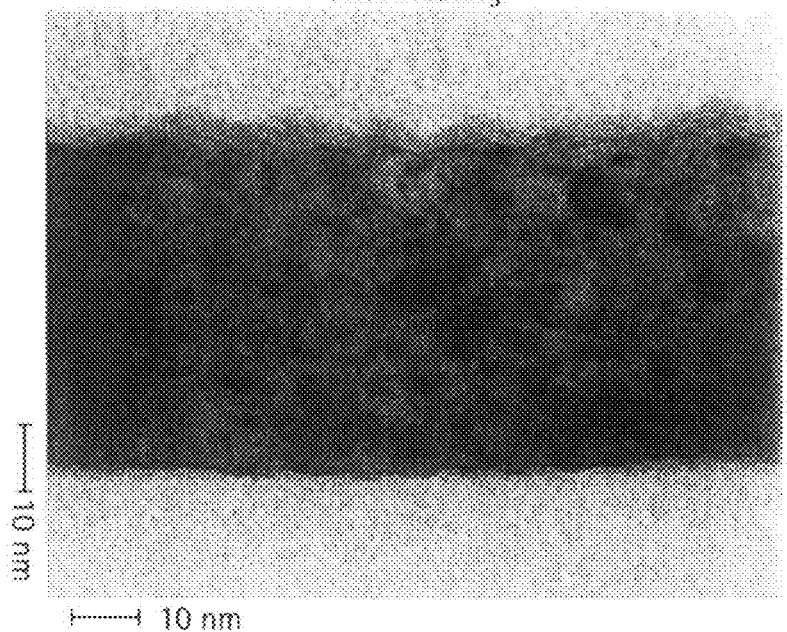
FIGS. 13A and 13B are a TEM image and a frame format of the TEM image.
Figure 13B:
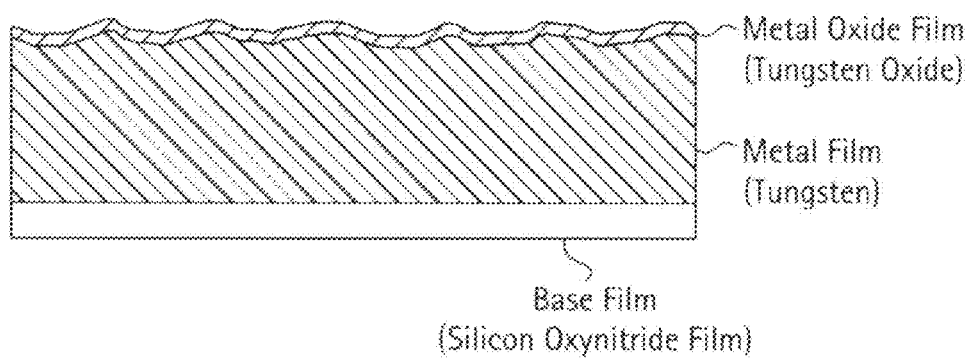
Figure 14A:
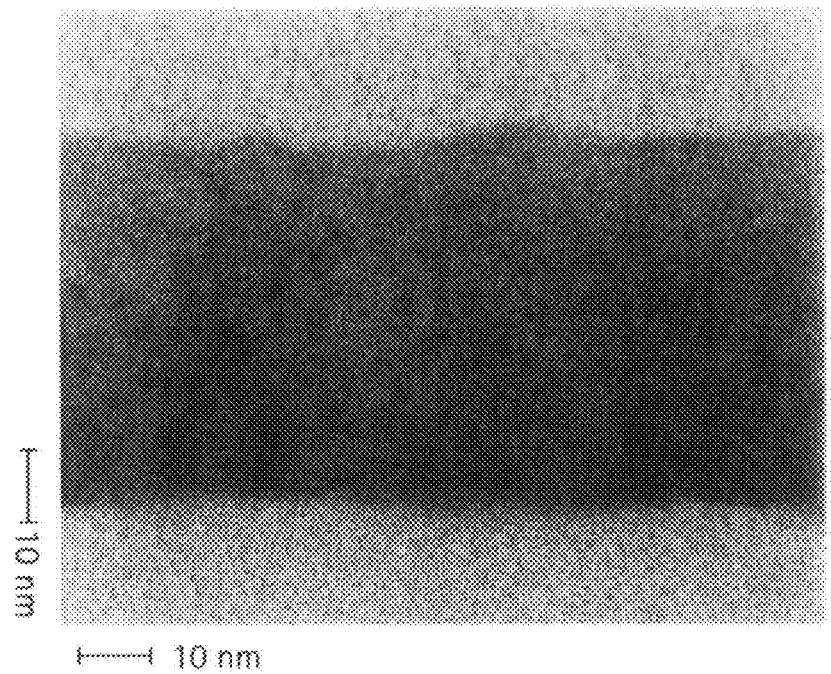
FIGS. 14A and 14B are a TEM image and a frame format of the TEM image.
Figure 14B:
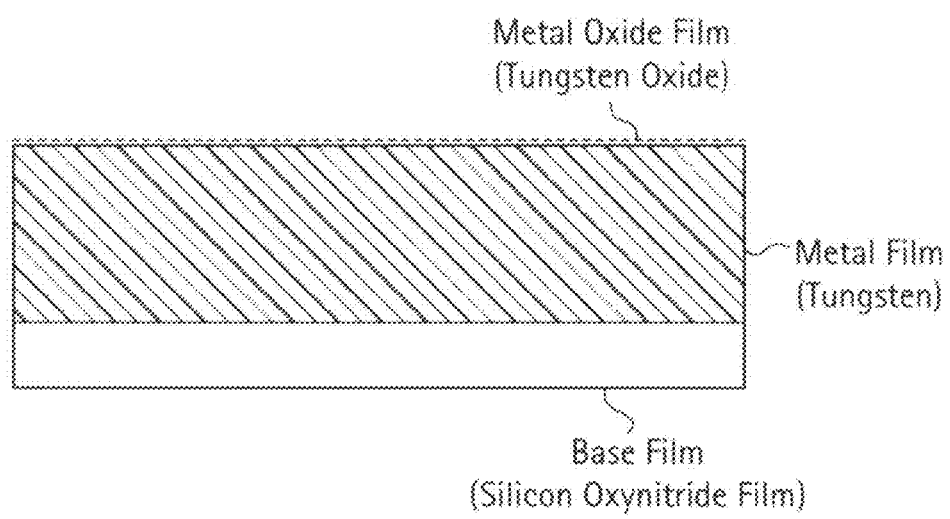
Figure 15A:
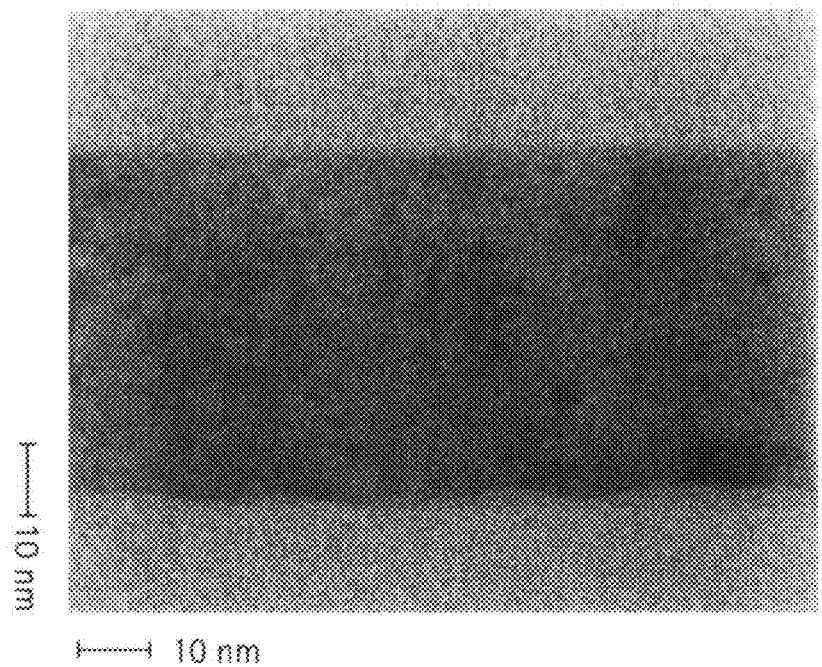
FIGS. 15A and 15B are a TEM image and a frame format of the TEM image.
Figure 15B:
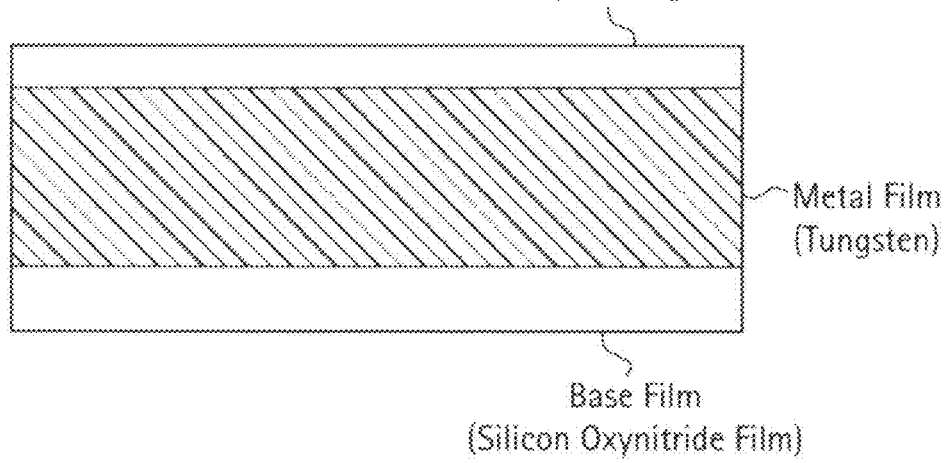
Figure 16A:
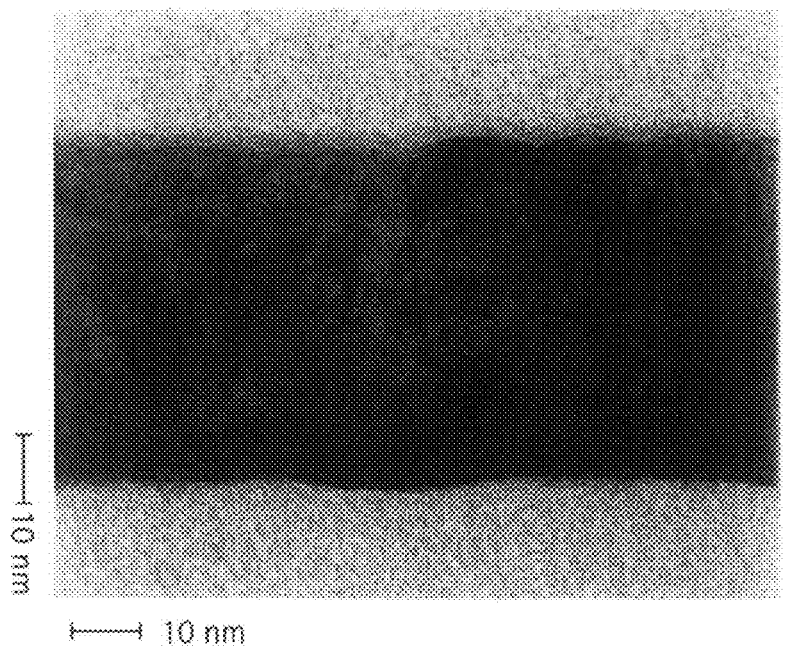
FIGS. 16A and 16B are a TEM image and a frame format of the TEM image.
Figure 16B:
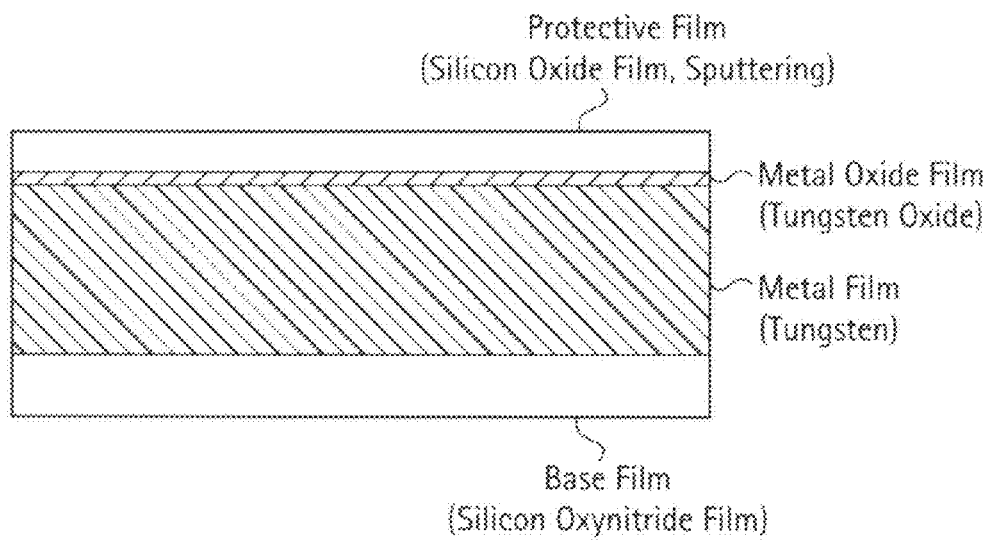
Figure 17A:
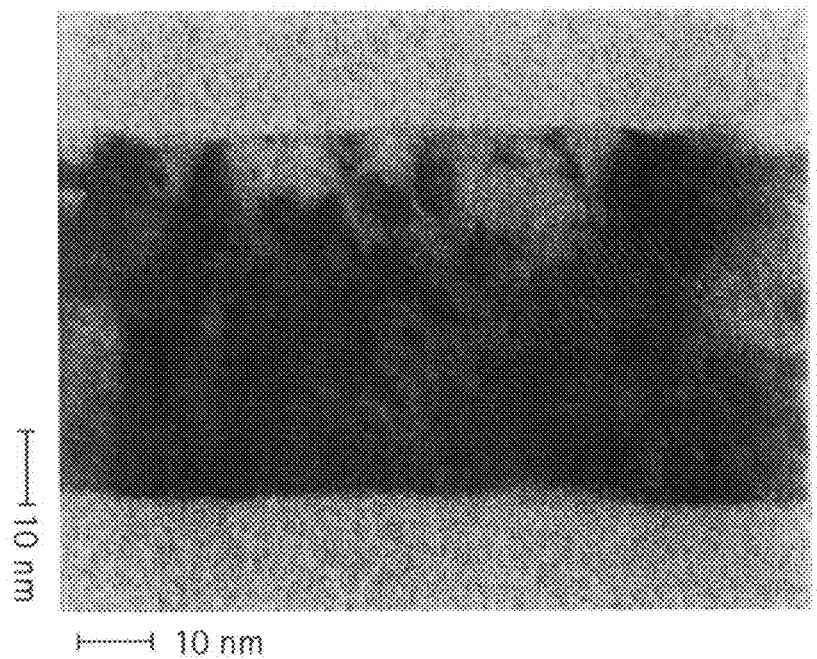
FIGS. 17A and 17B are a TEM image and a frame format of the TEM image.
Figure 17B:
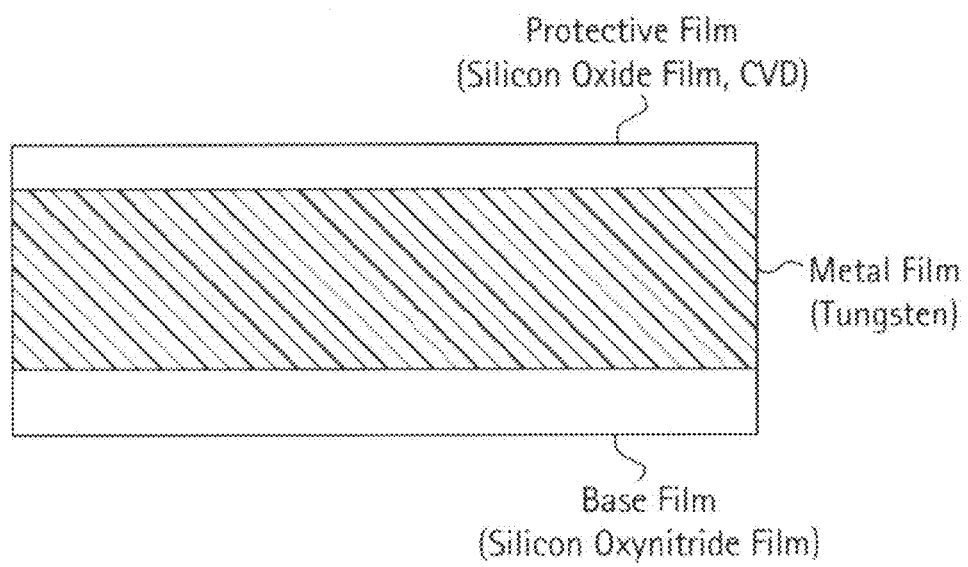

FIG. 12 is a TEM image showing the state that a tungsten film is deposited over a glass substrate by sputtering to have a thickness of 50 nm, and a silicon oxide film is deposited by sputtering thereon to have a thickness of 200 nm. FIG. 13 is a TEM image showing the state that is heat treated for 1 hour at 500° C. Both views show an surface boundary between the tungsten film and the silicon oxide film.

As shown in both views, a tungsten oxide film is formed at a surface boundary between the tungsten film and the tungsten oxide film. Unknown films in both views have almost same thickness of approximately 5 nm. Thus, the tungsten oxide film is formed independently from heat treatment and the film thickness is not influenced by the heat treatment. The tungsten oxide film is formed when the tungsten film and the tungsten oxide film are stacked. Next, compared with the crystal state of unknown films in FIGS. 12, 13 each other, the crystal lattice in FIG. 12 is uneven, but a part of the crystal lattice in FIG. 13 is formed even in certain direction. That is, the crystal state of the tungsten oxide film is dependent on heat treatment. Therefore an even sized crystal lattice is formed in the unknown film formed when the tungsten film and the tungsten oxide film are stacked by heat treatment.

In the lamination structure used in this experiment, the tungsten film is tried to be separated from the silicon oxide film at their surface boundary by a physical means such as a tape, but failed. Thus, separation is impossible in this manufacturing process in which the tungsten film and the tungsten oxide film are stacked, and heat treatment is carried out.

According to this experiment, oxide is crystallized by heat treatment, however, separation is impossible since reductive reaction is not occurred in the oxide in case that the heat treatment is not carried out after a film containing hydrogen is formed.

Experiment 6

In this experiment, four samples are prepared: a sample D formed by laminating over a glass substrate a silicon oxynitride film deposited as a base film by CVD and a tungsten film (W) deposited with a thickness of 50 nm as a metal film by sputtering; a sample E formed of an amorphous silicon film deposited as a protective film by sputtering using argon gas over the tungsten film; a sample F formed of a silicon oxide film deposited by sputtering using argon gas and oxygen gas over the tungsten film; and a sample G formed of a silicon oxide film deposited by CVD using silane gas and nitride gas over the tungsten film.

FIGS. 14A to 17A are TEM images showing cross-sectional views of each samples D to G. FIGS. 14B to 17B are frame formats showing each samples D to G. Look at a surface boundary between a tungsten film and an upper film of the tungsten film, a naturally oxidized film is formed over the tungsten film of the sample D in FIG. 14A, however, the thickness is too thin to be detected in the TEM image. A metal oxide film is not formed over tungsten films of the sample E in FIG. 15A and the sample G in FIG. 16A, however, a metal oxide film is formed over the tungsten film of the sample F. Thus, the metal oxide film is formed only over the tungsten film of the sample F. It can be considered that the metal oxide film is formed at an early stage of forming the silicon oxide film by preferential oxidative reaction of oxygen and tungsten due to oxygen gas used for forming the film. Based on the fact, the metal oxide film is not formed over the tungsten film in the sample E since only argon gas is used for a film formation.

Compared with the state of film formation between the sample F and the sample G, argon gas and oxygen gas are used in the sample F, and silane gas and $N_2O$ gas are used in the sample G. That is, the metal oxide film is not detected in the sample G by the reduction of the silicon oxide film formed between the tungsten film and silicon oxide film due to hydrogen since silane gas contains hydrogen.

According to this experiment, when the silicon oxide film is formed over the tungsten film, the metal oxide film is formed over the surface boundary between the silicon oxide film and the tungsten film. However, if gas containing hydrogen is used for forming a protective film, a metal oxide film is not formed at its surface boundary. The reason is that tungsten oxide (VI) ($WO_3$) reacts to hydrogen, and becomes into tungsten oxide (V) ($W_2O_5$), $W_4O_{11}$, and further, tungsten oxide (IV) ($WO_2$), metal tungsten (W) so that reductive reaction is occurred in the formed metal oxide film.

EXAMPLE 2

A light-emitting apparatus provided with TFTs fabricated over a film substrate by the separation method according to the present invention will be explained with reference to FIG. 18.

FIG. 18A is a top view of the light emitting apparatus, reference numeral 1210 denotes a film substrate; 1201, a signal line driver circuit; 1202, a pixel portion; and 1203, a scanning line driver circuit.

FIG. 18B is a cross-sectional view taken along a line A-A' of FIG. 18A. An oxide layer 1250 is formed over the film substrate 1210 via an adhesive 1240. The signal line driver circuit 1201 having a CMOS circuit composed of an n-channel TFT 1223 and a p-channel TFT 1224 is formed over the film substrate 1210. A TFT constituting a signal line driver circuit and a scanning line driver circuit can be formed by a CMOS circuit, a PMOS circuit, or an NMOS circuit. In this embodiment, a driver integrated type in which a signal line driver circuit and a scanning line driver circuit are formed over a substrate is described, but not exclusively, these circuits can be formed outside of the substrate.

A pixel portion 1220 is illustrated comprising an insulator 1214 that has a switching TFT 1221 and a current control TFT 1212, and that covers the switching TFT 1221 and the current control TFT 1212, and that has an opening portion in the prescribed position; a first electrode 1213 connected to one of wirings of the current control TFT 1212; organic compound layer 1215 formed over the first electrode; a light-emitting device 1218 having a second electrode 1216 that is opposed to the first electrode; and a protective layer 1217 for preventing deterioration of the light-emitting device due to moisture and oxygen.

Since the first electrode 1213 is connected to the drain of the current control TFT 1212, at least lower side of the first electrode 1213 is preferably formed by the material that can make ohmic contact with the drain region of a semiconductor film, and the surface that is contact to the organic compound layer is preferably formed by a material having a large work function. For example, in case that a three-layer structure composed of a titanium nitride film, a film containing aluminum as its main components, and a titanium film is adopted, resistance as a wiring is low and favorable ohmic contact can be made. The first electrode 1213 can be formed into a single layer formed of a titanium nitride film, and formed into a three or more layers structure. Further, if a transparent conductive film is used for the first electrode 1213, a dual emission type light-emitting apparatus can be manufactured.

The insulator 1214 can be formed of an organic resin film or an insulating film containing silicon. Here, a positive type photosensitive acrylic resin film is used for forming the insulator 1214.

For improving a coverage effect, an upper edge portion or a lower edge portion of the insulator 1214 is preferably formed to have a curved surface having a curvature. For example, when the positive type photosensitive acrylic resin is used as a material for the insulator 1214, only the upper edge portion of the insulator 1214 is formed preferably to have a curved surface having a radius of curvature (0.2 to 3 µm). As for the insulator 1214, either a negative type which becomes insoluble to an etchant by photosensitive light, and a positive type which becomes soluble to the etchant by light can be used.

Further, the insulator 1214 may be covered by a protective film formed of an aluminum nitride film, an aluminum nitride oxide film, or a silicon nitride film. The protective film is an insulating film containing silicon nitride or silicon nitride oxide as its main components deposited in a film formation system by sputtering (DC type or RF type) or remote plasma, or a thin film containing carbon as its main components. The thickness of the protective film is preferably formed into thin as much as possible to pass light through the protective film.

An organic compound layer 1215 is selectively deposited over the first electrode 1213 by vapor deposition using an evaporation mask, or an ink-jetting. Further, a second electrode 1216 is formed over the organic compound layer 1215. A color filter composed of a coloring layer and a BM is provided to light-emitting device 1218 since the light-emitting device 1218 emits white light.

If organic compound layers each of which emits light of R, G, B are selectively formed, full color display can be achieved without using the color filter.

The second electrode 1216 is connected to a connecting wiring 1208 via an opening portion (contact) provided with the insulator 1214 in a connecting region. The connecting wiring 1208 is connected to a FPC (flexible printed circuit) 1209 by an anisotropic conductive resin. The connecting wiring 1208 receives a video signal and a clock signal from the FPC 1209 that serves as an external input terminal. A printed wiring board (PWB) can be attached to the FPC.

A sealing agent 1205 is provided to the periphery of the substrate to paste second film substrate 1204 to the substrate and to seal the light-emitting device. An epoxy resin is preferably used for the sealing agent 1205.

In this embodiment, a plastic substrate made of fiberglass-reinforced plastics (FRP), polyvinyl fluoride (PVF), Mylar, polyester, an acrylic resin, or the like, in addition to a glass substrate or a quartz substrate, can be used as a material for forming the second film substrate 1204.

Although not shown in the drawings, a barrier film formed of an organic material such as polyvinyl alcohol, or ethylene-vinylalcohol copolymer; an inorganic material such as polysilazane, aluminum oxide, silicon oxide, or silicon nitride; or a lamination layer formed of these materials may cover the film substrate to prevent moisture and oxygen from penetrating into the film substrate.

Further, a protective layer can be formed to prevent chemicals during a manufacturing process. As a material for forming the protective layer, a UV cured resin or a thermal cured resin can be used.

Accordingly, a light-emitting apparatus having TFTs over a film substrate is completed. The light-emitting apparatus having TFTs according to the present invention is light-weight, and is hardly broken even if the apparatus falls. Using the film substrate makes it possible to grow the light-emitting apparatus in size for a mass-production.

EXAMPLE 3

A liquid crystal display apparatus provided with TFTs formed over a film substrate by a separation method according to the present invention will be explained with reference to FIG. 19.

Figure 19A:
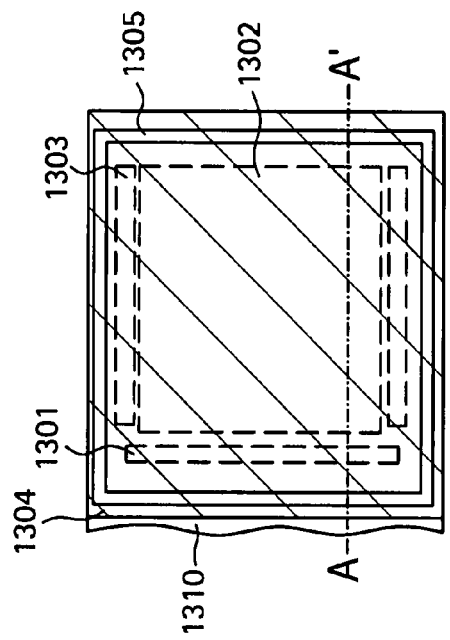
FIGS. 19A and 19B are an external view and a cross-sectional view of a light-emitting apparatus.

FIG. 19A is a top surface view of a liquid crystal display apparatus. Reference numeral 1310 denotes a first film substrate; 1301, a signal driver circuit; 1303, a scanning driver circuit; and 1302, a pixel portion.

Figure 19B:
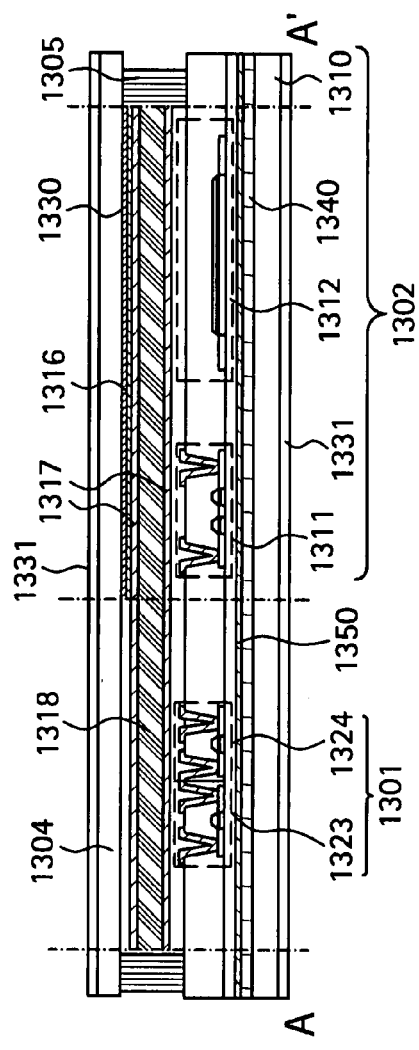

FIG. 19B is a cross-sectional view of a liquid crystal display apparatus taken along the line A-A'. A oxide layer 1350 is formed over the film substrate 1310 via an adhesive 1340.

Reference numeral 1301 denotes a signal line driver circuit 1301 provided with a CMOS circuit composed of an n-channel TFT 1323 and a p-channel TFT 1324 over the film substrate 1310. A TFT constituting a signal line driver circuit and a scanning line driver circuit can be formed by a CMOS circuit, a PMOS circuit, or an NMOS circuit. In this embodiment, a driver integrated type in which a signal line driver circuit and a scanning line driver circuit are formed over a substrate is described, but not exclusively, these circuits can be formed outside of the substrate.

The pixel portion 1302 is illustrated that it includes an interlayer insulating film 1314 having a switching TFT 1311 and a retention volume 1312 and covering the switching TFT 1311 and the retention volume 1312.

An oriented film 1317 is formed over the interlayer insulating film 1314 and subjected rubbing treatment.

A second film substrate 1304 is prepared as an opposing substrate. The second film substrate 1304 comprises a color filter 1330 in the region that is divided in matrix configuration by resin or the like, an opposing electrode 1316, and the oriented film 1317.

A deflecting plate 1331 is provided over the first and the second film substrate and bonded thereto with a sealant 1305. A liquid crystal material 1318 is infected between the first and the second film substrate.

Although not shown in the drawings, barrier film formed of an organic material such as polyvinyl alcohol, or ethylene-vinylalcohol copolymer; an inorganic material such as silicon oxide; or a lamination layer formed of these materials may cover the film substrate to prevent moisture and oxygen from penetrating into the film substrate.

Further, a protective layer can be formed to prevent chemicals during a manufacturing process. As a material for forming the protective layer, a UV cured resin or a thermal cured resin can be used.

As in FIG. 18, the film substrate connects to a wire and a FPC by anisotropic conductive resin and receives a video signal, clock signal, and the like.

Accordingly, a light-emitting apparatus having TFTs over a film substrate is completed. The light-emitting apparatus having TFTs according to the present invention is light-weight, and is hardly broken even if the apparatus falls. Using the film substrate makes it possible to grow the light-emitting apparatus in size for a mass-production.

EXAMPLE 4

An example of the present invention will be explained with reference to FIG. 20. A panel installed with a pixel portion and a driver circuit for controlling the pixel portion over one insulating surface; and a memory circuit and a CPU will be explained in this example.

Figure 20A:
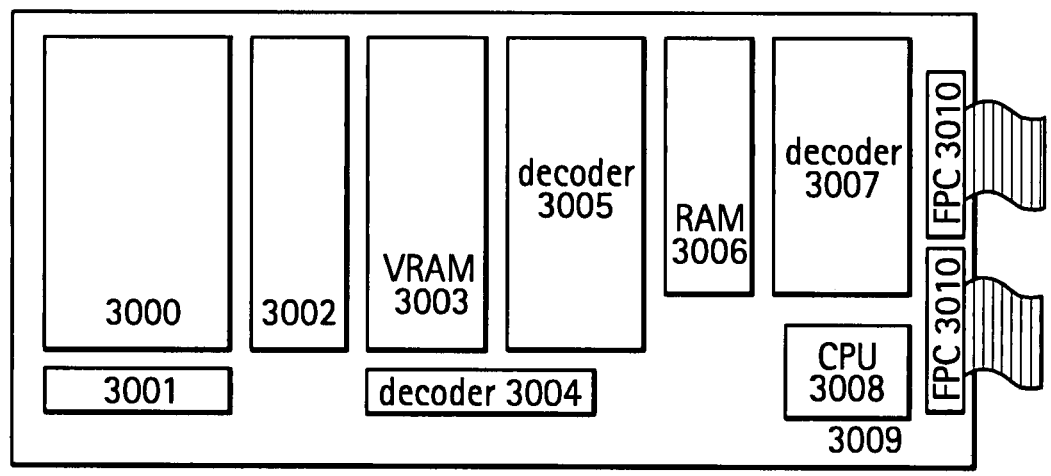
FIGS. 20A and 20B are an external view and a cross-sectional view of a light-emitting apparatus.
Figure 20B:
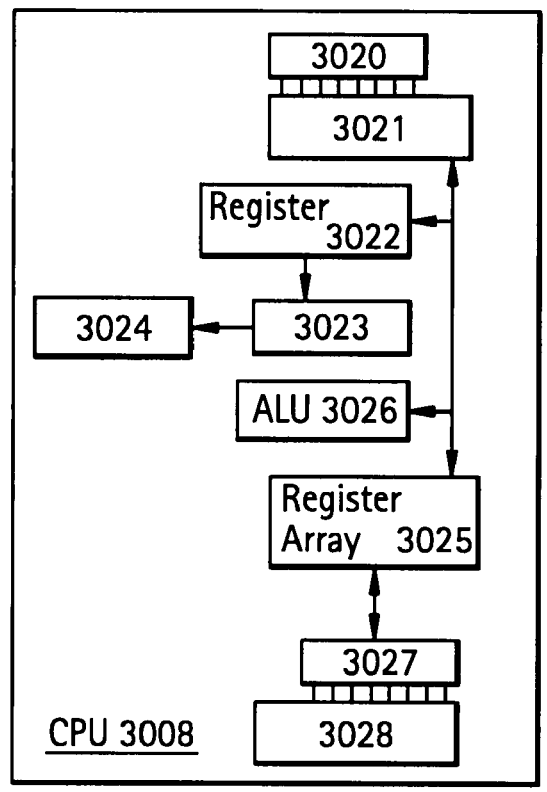

FIG. 20 is an external view of a panel. The panel has a pixel portion 3000 composed of a plurality of pixels arranged in a matrix configuration over a substrate 3009. A scanning line driver circuit 3001 for controlling the pixel portion 3000 and a signal line driver circuit 3002 are formed at the periphery of the pixel portion 3000. The pixel portion 3000 displays an image depending on signals transmitted from the driver circuit. An opposing substrate can be provided over only the pixel portion 3000, the driver circuits 3001, and 3002, and also over the whole surface. In case of providing the substrate over the CPU 3008, note that the opposing substrate is preferably arranged to make a heat radiation sheet contact with the CPU 3008 since the CPU may generate heat. Further, the panel also has a VRAM 3003 (video random access memory) for controlling the driver circuits 3001, 3002, and decoders 3004, 3005 at the periphery of the VRAM 3000. In addition, the panel has a RAM (random access memory) 3006, a decoder 3007 at the periphery of the RAM 3006, and the CPU 3008. All devices composing a circuit over the substrate 3009 are formed of polycrystalline semiconductor (polysilicon) that has higher field-effect mobility and larger ON current than that of amorphous semiconductor. Therefore a plurality of circuits can be formed into an integrated circuit over one insulating surface. A pixel portion 3001, a driver circuits 3001, 3002, and another circuit are formed over a support substrate, and peeled by the separation method according to the present invention, then, pasted each other to realize an integrated structure over a flexible substrate 3009. The structure of the plurality of pixels in the pixel portion is, but not exclusively, formed by providing SRAM to each the plurality of pixels. According to this, VRAM 3003 and RAM 3006 can be omitted.

Next, the structure of the CPU is briefly explained. The CPU has a control unit and an arithmetic circuit. Upon inputting opcode to a data bus 3020 for inputting and outputting data such as values used for an operation result and an operation, and instructions, instructions are once stored in a resistor 3022 via a data bus interface 3021, and analyzed in a decoder 3023. Then, each control signal is generated in a control unit 3024, and memory read cycle, memory write cycle, and the like are carried out depending on the inputted opcode. In addition, the CPU has a resistor array 3025 that is a memory used in the CPU, and that serves as an internal resistor, ALU 3026 for arithmetical operation and logical operation, a logic and buffer 3027 for controlling an output of address and buffer, and an address bus 3028 for inputting and outputting address such as a memory space.

The driver circuits 3001, 3002, and the CPU 3008 can be provided to the exterior of the substrate 3009. Here, a plurality of circuits are formed over the insulating surface, but circuits can be formed into a narrow frame shape by building up semiconductor devices. For example, pixel portions for displaying images are stacked over a circuit such as a CPU, and such structure will be more helpful for electric appliances that are required to be downsizing and lightweight.

EXAMPLE 5

The present invention can be applied to various electric appliances. Given as examples as the electric appliances: a personal digital assistance (a cellular phone, a mobile computer, a portable game machine, an electronic book, or the like), a video camera, a digital camera, a goggle type display, a display, a navigation system, and the like. FIGS. 21A to 21E are views showing these electric appliances.

Figure 21A:
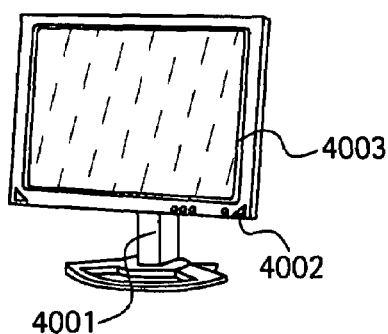
FIGS. 21A to 21E are views showing electric appliances.
Figure 21B:
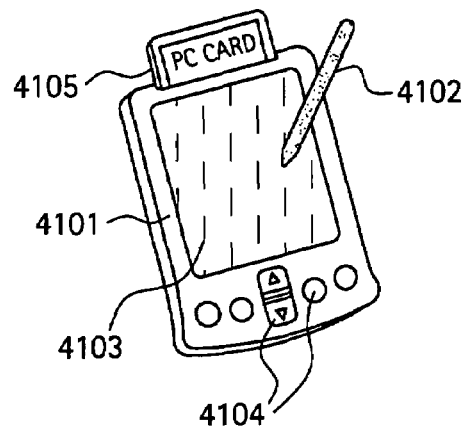

FIG. 21A shows a display having a frame 4001, a sound output unit 4002, a display unit 4003, and the like. The present invention is used to the display unit 4003. The display includes all information display apparatus such as a personal computer, a TV broadcasting, and an advertisement display. FIG. 21B shows a mobile computer having a main body 4101, a stylus 4102, a display unit 4103, an operation button 4104, an external interface 4105, and the like. The present invention is used to the display unit 4103.

Figure 21C:
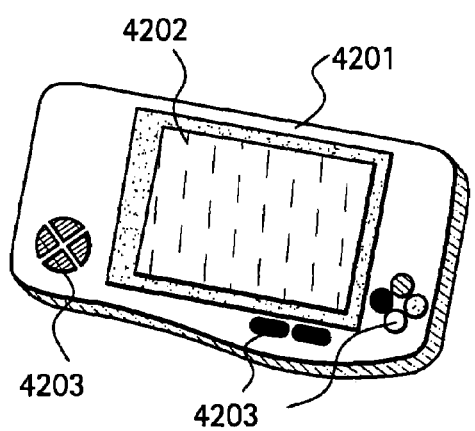
Figure 21D:
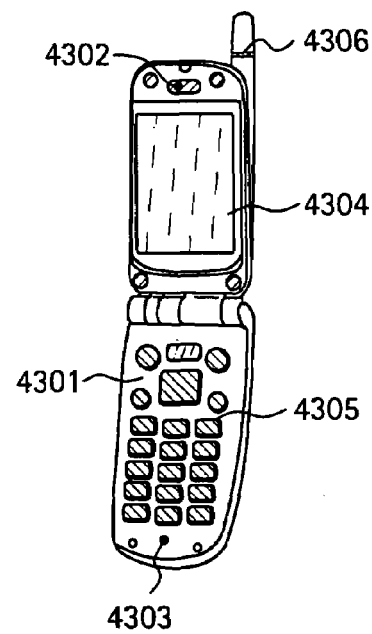
Figure 21E:
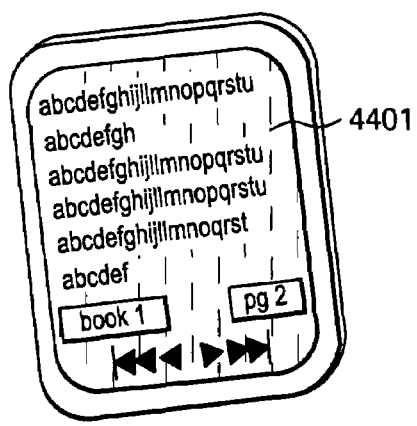

FIG. 21C shows a game machine having a main body 4201, a display unit 4202, an operation button 4203, and the like. The present invention is used to the display unit 4202. FIG. 21D is a cellular phone having a main body 4301, a sound output unit 4302, a sound input unit 4303, a display unit 4304, an operation switch 4305, an antenna 4306, and the like. The present invention is used to the display unit 4304. FIG. 21E shows a electronic book reader having a display unit 4401, and the like. The present invention is used to the display unit 4401.

The application range of the present invention is extremely large, so that the present invention can be used to various electric appliances in many fields. Especially, the present invention that enables apparatus to be thin film and lightweight are helpful for the electric appliances illustrated in FIGS. 21A to 21E.

What is claimed is:

1. A method for manufacturing a semiconductor device comprising:
    forming a metal film over a first substrate;
    forming an oxide film over the metal film;
    forming at least a transistor including a semiconductor film containing hydrogen over the oxide film;
    forming an insulating film over the transistor;
    bonding a second substrate to the insulating film;
    separating at least the transistor and the insulating film from the first substrate by heating to diffuse hydrogen contained in the semiconductor film and reducing metal oxide formed at a surface boundary between the metal film and the oxide film.

2. A method according to claim 1, wherein the transistor and the insulating film are separated from the first substrate in the reduced metal oxide, a surface boundary between the reduced metal oxide and the metal film, or a surface boundary between the reduced metal oxide and the oxide film.

3. A method according to claim 1, wherein the metal film is formed of an element selected from the group consisting of W (tungsten), Ti (titanium), Mo (molybdenum), Cr (chrome), Nd (neodymium), Fe (iron), Ni (nickel), Co (cobalt), Zr (zirconium), Zn (zinc), Ru (ruthenium), Rh (rhodium), Pd (palladium), Os (osmium), Ir (iridium); a single layer formed of an alloy material or a compound material, each of which contains the above elements as its main components; or a lamination layer formed of these metals or mixture of these metals.

4. A method according to claim 1, wherein the heating treatment is carried out at 400° C. or higher.

5. A method according to claim 1, wherein the reduced metal oxide and the metal oxide are crystallized.

6. A method according to claim 1, wherein the oxide film is formed of a silicon oxide film deposited by sputtering.

7. A method according to claim 1, wherein the semiconductor film is formed of a silicon film deposited by CVD.

8. A method for manufacturing a semiconductor device comprising:
    forming a metal film over a first substrate;
    forming an oxide film over the metal film;
    forming at least a transistor including a nitride film containing hydrogen over the oxide film;
    forming an insulating film over the transistor;
    bonding a second substrate to the insulating film;
    separating at least the transistor and the insulating film from the first substrate by heating to diffuse hydrogen contained in the nitride film and reducing metal oxide formed at a surface boundary between the metal film and the oxide film.

9. A method according to claim 8, wherein the transistor and the insulating film are separated from the first substrate in the reduced metal oxide, a surface boundary between the reduced metal oxide and the metal film, or a surface boundary between the reduced metal oxide and the oxide film.

10. A method according to claim 8, wherein the metal film is formed of an element selected from the group consisting of W (tungsten), Ti (titanium), Mo (molybdenum), Cr (chrome), Nd (neodymium), Fe (iron), Ni (nickel), Co (cobalt), Zr (zirconium), Zn (zinc), Ru (ruthenium), Rh (rhodium), Pd (palladium), Os (osmium), Ir (iridium); a single layer formed of an alloy material or a compound material, each of which contains the above elements as its main components; or a lamination layer formed of these metals or mixture of these metals.

11. A method according to claim 8, wherein the heating treatment is carried out at 400° C. or higher.

12. A method according to claim 8, wherein the reduced metal oxide and the metal oxide are crystallized.

13. A method according to claim 8, wherein the oxide film is formed of a silicon oxide film deposited by sputtering.

14. A method according to claim 8, wherein the semiconductor film is formed of a silicon film deposited by CVD.

15. A method for manufacturing a semiconductor device comprising:
   forming a metal film over a first substrate;
   forming an oxide film over the metal film;
   forming at least a transistor including a semiconductor film containing hydrogen over the oxide film;
   forming an insulating film over the transistor;
   heating to diffuse hydrogen contained in the semiconductor film and reducing metal oxide formed at a surface boundary between the metal film and the oxide film,
   bonding a second substrate to the insulating film;
   separating at least the transistor and the insulating film from the first substrate.

16. A method according to claim 15, wherein the transistor and the insulating film are separated from the first substrate in the reduced metal oxide, a surface boundary between the reduced metal oxide and the metal film, or a surface boundary between the reduced metal oxide and the oxide film.

17. A method according to claim 15, wherein the metal film is formed of an element selected from the group consisting of W (tungsten), Ti (titanium), Mo (molybdenum), Cr (chrome), Nd (neodymium), Fe (iron), Ni (nickel), Co (cobalt), Zr (zirconium), Zn (zinc), Ru (ruthenium), Rh (rhodium), Pd (palladium), Os (osmium), Ir (iridium); a single layer formed of an alloy material or a compound material, each of which contains the above elements as its main components; or a lamination layer formed of these metals or mixture of these metals.

18. A method according to claim 15, wherein the heating treatment is carried out at 400° C. or higher.

19. A method according to claim 15, wherein the reduced metal oxide and the metal oxide are crystallized.

20. A method according to claim 15, wherein the oxide film is formed of a silicon oxide film deposited by sputtering.

21. A method according to claim 15, wherein the semiconductor film is formed of a silicon film deposited by CVD.

22. A method for manufacturing a semiconductor device comprising:
   forming a metal film over a first substrate;
   forming an oxide film over the metal film;
   forming at least a transistor including a nitride film containing hydrogen over the oxide film;
   forming an insulating film over the transistor;
   heating to diffuse hydrogen contained in the nitride film and reducing metal oxide formed at a surface boundary between the metal film and the oxide film,
   bonding a second substrate to the insulating film;
   separating at least the transistor and the insulating film from the first substrate.

23. A method according to claim 22, wherein the transistor and the insulating film are separated from the first substrate in the reduced metal oxide, a surface boundary between the reduced metal oxide and the metal film, or a surface boundary between the reduced metal oxide and the oxide film.

24. A method according to claim 22, wherein the metal film is formed of an element selected from the group consisting of W (tungsten), Ti (titanium), Mo (molybdenum), Cr (chrome), Nd (neodymium), Fe (iron), Ni (nickel), Co (cobalt), Zr (zirconium), Zn (zinc), Ru (ruthenium), Rh (rhodium), Pd (palladium), Os (osmium), Ir (iridium); a single layer formed of an alloy material or a compound material, each of which contains the above elements as its main components; or a lamination layer formed of these metals or mixture of these metals.

25. A method according to claim 22, wherein the heating treatment is carried out at 400° C. or higher.

26. A method according to claim 22, wherein the reduced metal oxide and the metal oxide are crystallized.

27. A method according to claim 22, wherein the oxide film is formed of a silicon oxide film deposited by sputtering.

28. A method according to claim 22, wherein the semiconductor film is formed of a silicon film deposited by CVD.

* * * * *